United States Patent
Kwon et al.

(10) Patent No.: US 11,462,255 B2
(45) Date of Patent: Oct. 4, 2022

(54) MEMORY DEVICE, A CONTROLLER FOR CONTROLLING THE SAME, A MEMORY SYSTEM INCLUDING THE SAME, AND A METHOD OF OPERATING THE SAME

(71) Applicant: SAMSUNG ELECTRONICS CO., LTD., Suwon-si (KR)

(72) Inventors: Youngcheon Kwon, Hwaseong-si (KR); Jaeyoun Youn, Seoul (KR); Namsung Kim, Yongin-si (KR); Kyomin Sohn, Yongin-si (KR); Seongil O, Suwon-si (KR); Sukhan Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/239,854

(22) Filed: Apr. 26, 2021

(65) Prior Publication Data

US 2022/0068366 A1    Mar. 3, 2022

(30) Foreign Application Priority Data

Sep. 3, 2020   (KR) .......................... 10-2020-0112495

(51) Int. Cl.
*G11C 11/406*   (2006.01)
*G11C 11/4076*   (2006.01)
(Continued)

(52) U.S. Cl.
CPC ...... *G11C 11/40618* (2013.01); *G11C 7/1045* (2013.01); *G11C 7/1048* (2013.01);
(Continued)

(58) Field of Classification Search
CPC ........ G11C 11/40618; G11C 11/40622; G11C 11/4076; G11C 11/408; G11C 7/1045; G11C 7/1048
(Continued)

(56) References Cited

U.S. PATENT DOCUMENTS 6,515,928 B2   2/2003  Sato et al.
9,721,640 B2   8/2017  Bains et al.
(Continued)

FOREIGN PATENT DOCUMENTS

JP    1995-085357      9/1995
KR    10-2016-0116533   10/2016
(Continued)

OTHER PUBLICATIONS

European Search Report dated Dec. 13, 2021 in corresponding European Patent Application No. EP 21178567.0.
(Continued)

*Primary Examiner* — Son L Mai
(74) *Attorney, Agent, or Firm* — F. Chau & Associates, LLC

(57) ABSTRACT

A memory device including: a plurality of pins for receiving control signals from an external device; a first bank having first memory cells, wherein the first bank is activated in a first operation mode and a second operation mode; a second bank having second memory cells, wherein the second bank is deactivated in the first operation mode and activated in the second operation mode; a processing unit configured to perform an operation on first data, output from the first memory cells, and second data, output from the second memory cells, in the second operation mode; and a processing-in-memory (PIM) mode controller configured to select mode information, indicating one of the first operation mode and the second operation mode, in response to the control signals and to control at least one memory parameter, at least one mode register set (MRS) value, or a refresh mode according to the mode information.

20 Claims, 17 Drawing Sheets

(51) Int. Cl.
*G11C 11/408* (2006.01)
*G11C 7/10* (2006.01)

(52) U.S. Cl.
CPC ........ *G11C 11/408* (2013.01); *G11C 11/4076* (2013.01); *G11C 11/40622* (2013.01)

(58) Field of Classification Search
USPC ........................................................ 365/222
See application file for complete search history.

(56) References Cited

U.S. PATENT DOCUMENTS

| | | | |
|---|---|---|---|
| 9,875,785 B2 | 1/2018 | Jose et al. | |
| 10,120,794 B2* | 11/2018 | Shin | G11C 7/1039 |
| 11,079,936 B2* | 8/2021 | Chang | G06F 9/30196 |
| 2002/0191467 A1 | 12/2002 | Matsumoto et al. | |
| 2015/0046631 A1 | 2/2015 | Prather | |
| 2017/0344301 A1 | 11/2017 | Ryu et al. | |
| 2018/0247690 A1 | 8/2018 | Lee et al. | |
| 2019/0096453 A1 | 3/2019 | Shin et al. | |
| 2019/0114265 A1 | 4/2019 | Chang et al. | |
| 2019/0317545 A1 | 10/2019 | Lee et al. | |
| 2020/0066330 A1 | 2/2020 | Hu et al. | |
| 2020/0174749 A1* | 6/2020 | Kang | G11C 7/22 |
| 2021/0089390 A1* | 3/2021 | Lee | G06F 7/50 |
| 2021/0134345 A1* | 5/2021 | Kwon | G11C 11/40618 |

FOREIGN PATENT DOCUMENTS

| | | |
|---|---|---|
| KR | 10-2019-0036358 | 4/2019 |
| TW | I224337 | 11/2004 |
| TW | I590250 | 7/2017 |
| TW | I665683 | 7/2019 |
| WO | 2020081431 | 4/2020 |

OTHER PUBLICATIONS

Taiwan Office Action dated Mar. 28, 2022 in corresponding Taiwanese Patent Application No. TW 110119207.

* cited by examiner

| MRS CMD | MA[4:0] | OP7 | OP6 | OP5 | OP4 | OP3 | OP2 | OP1 | OP0 |
|---|---|---|---|---|---|---|---|---|---|
| | 01000 | BA3"H" | BA3"L" | PC | SID1 | SID0 | Mode exit | Mode entry | DA Port Lockout |
| Default (normal mode) | | 0 | 0 | 0 | 0 | 0 | 0 | 0 | X |
| All Bank PIM mode | | 1 | 1 | 0 | 0 | 1 | 0 | 1 | X |
| 0~7 Bank PIM mode | | 0 | 1 | 1 | 0 | 1 | 0 | 1 | X |
| All Bank PIM mode exit | | 1 | 1 | 0 | 1 | 0 | 1 | 0 | X |

FIG. 9

MEMORY DEVICE, A CONTROLLER FOR CONTROLLING THE SAME, A MEMORY SYSTEM INCLUDING THE SAME, AND A METHOD OF OPERATING THE SAME

CROSS-REFERENCE TO RELATED APPLICATION(S)

This application claims priority under 35 U.S.C. § 119 to Korean Patent Application No. 10-2020-0112495 filed on Sep. 3, 2020 in the Korean Intellectual Property Office, the disclosure of which is incorporated by reference herein in its entirety.

TECHNICAL FIELD

The present disclosure relates to a memory device, a controller for controlling the same, a memory system including the same, and a method of operating the same.

DISCUSSION OF RELATED ART

A dynamic random access memory (DRAM) is a type of random-access semiconductor memory that stores each bit in a memory cell consisting of a capacitor and a transistor. Since DRAM has high response speed and high operation speed, the DRAM may be used as a main memory of a system. A typical DRAM writes data or outputs written data under control of a host. Recently, a DRAM including an internal processor configured to perform a portion of an operation of a host or a central processing unit (CPU) has been developed. This paradigm is referred to as processing-in-memory (PIM).

SUMMARY

Example embodiments of the present disclosure provide a memory device operating in a dual operation mode, a memory system including the same, a controller controlling the same, and a method of operating the same.

Example embodiments of the present disclosure provide a memory device performing an internal operation under optimal environment conditions, a memory system including the same, a controller controlling the same, and a method of operating the same.

Example embodiments of the present disclosure provide a memory device implemented with a dual operation mode structure, a memory system including the same, a controller controlling the same, and a method of operating the same.

According to an example embodiment of the present disclosure, there is provided a memory device including: a plurality of pins for receiving control signals from an external device; a first bank having first memory cells, wherein the first bank is activated in a first operation mode and a second operation mode; a second bank having second memory cells, wherein the second bank is deactivated in the first operation mode and activated in the second operation mode; a processing unit configured to perform an operation on first data, output from the first memory cells, and second data, output from the second memory cells, in the second operation mode; and a processing-in-memory (PIM) mode controller configured to select mode information, indicating one of the first operation mode and the second operation mode, in response to the control signals and to control at least one memory parameter, at least one mode register set (MRS) value, or a refresh mode according to the mode information.

According to an example embodiment of the present disclosure, there is provided a memory system including: a memory device configured to operate in one of a first operation mode and a second operation mode in response to a mode change command, wherein the memory device includes first banks and second banks; and a controller configured to control the memory device, wherein the controller includes a PIM mode generator configured to generate a mode change command for selecting one of the first and second operation modes, wherein the memory device includes: a plurality of pins for receiving a plurality of control signals from the controller; a PIM mode controller configured to activate one of the first and second banks in the first operation mode and to activate at least one of the first banks and at least one of the second banks in the second operation mode in response to the mode change command; and a processing unit configured to perform an operation on first data output from the activated first bank and second data output from the activated second bank.

According to an example embodiment of the present disclosure, a method of operating a memory device includes: receiving a mode change request from a controller; changing an operation mode of the memory device in response to the mode change request; receiving an internal operation request in the changed operation mode; and performing an operation on data output from at least two activated banks in response to the internal operation request.

According to an example embodiment of the present disclosure, there is provided a controller for controlling a memory device, the controller including: a clock generator configured to generate a clock and to output the clock to the memory device; a command address generator configured to generate a command address signal to operate the memory device; a command address transmitter configured to transmit the command address signal in response to the clock; and a PIM mode generator configured to generate a mode change command for selecting one of a first operation mode and a second operation mode, wherein among a plurality of banks of the memory device, one bank is activated in response to an operation command in the first operation mode, among the plurality of banks of the memory device, at least two banks are activated in response to an operation command in the second operation mode, and an operation mode and an internal operation environment of the memory device are dynamically changed in response to the mode change command.

According to an example embodiment of the present disclosure, there is provided a memory device including: a pin for receiving a mode change command from a controller; a PIM mode controller configured to activate one of first and second memory banks in a first operation mode when the mode change command identifies the first operation mode and to activate the first bank and the second bank in a second operation mode when the mode change command identifies the second operation mode; and a processing unit configured to perform an operation on first data output when the first bank is activated and second data output when the second bank is activated.

BRIEF DESCRIPTION OF THE DRAWINGS

The above and other features of the present disclosure will be more clearly understood by describing in detail example embodiments thereof in conjunction with the accompanying drawings.

FIG. 9 is a view illustrating an example of an operation code illustrated in FIG. 8.

DETAILED DESCRIPTION OF THE EMBODIMENTS

Figure 1:
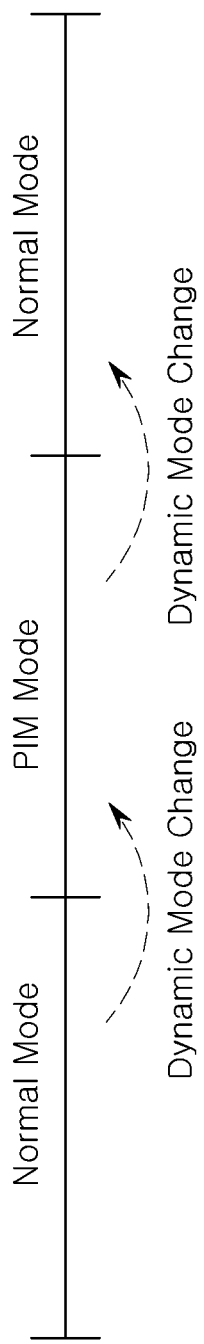
FIG. 1 is a diagram of a memory system according to an example embodiment of the present disclosure.

Hereinafter, example embodiments of the present disclosure will be described with reference to the accompanying drawings. Like reference numerals may refer to like elements throughout this disclosure.

In general, multiple banks are activated by a single command in a processing-in-memory (PIM) mode, whereas a single bank is activated by a single command in a normal mode. Accordingly, an internal operation or an operation environment of a memory device may significantly vary according to its operation mode. Therefore, both a memory device and a controller may dynamically change modes to change an operation mode.

In a memory system according to an example embodiment of the present disclosure, information for an operation mode change may be shared by a memory device, including an internal process, and a controller to reduce unnecessary memory setting times caused by the operation mode change (for example, a memory parameter setting time, a mode register set (MRS) setting time, and the like).

FIG. 1 is a diagram of a memory system according to an example embodiment. Referring to FIG. 1, a memory system may change an operation mode of a memory device from a normal mode to a processing-in-memory (PIM) mode, and vice versa. The PIM mode is a mode in which a memory device performs an operation. Accordingly, a single bank is activated by a single command in the normal mode, whereas multiple banks may be activated by a single command in the PIM mode.

In a memory system according to an example embodiment of the present disclosure, a memory device having two operation modes may dynamically change an operation mode of the memory device and an internal operation environment of the memory device according to the operation mode. In example embodiments of the present disclosure, a controller of the memory system may generate a command for controlling the memory device and transmit the command to the memory device, and may internally and dynamically vary memory parameters (for example, tRCD, tRC, tRRD, tFAW, and the like), MRS values (RL, WL, WR, RAS, and the like), and a refresh mode provided in the controller to control the memory device. In example embodiments of the present disclosure, the memory device may receive a command for a mode change from the controller and may internally change an internal setting of the memory device with the same value as an MRS value of the controller. In example embodiments of the present disclosure, the memory device may receive a command for a mode change from the controller and may dynamically change a normal mode, in which a single bank operates, and a PIM mode in which multiple banks operate.

In example embodiments of the present disclosure, the controller may generate and apply an all-bank precharge command before and after an operation mode change to dynamically change an operation mode of the memory device. In example embodiments of the present disclosure, the memory device may receive a mode change command from the controller and may internally perform all-bank precharge operation before and after an operation mode change.

In a memory system according to an example embodiment of the present disclosure, information associated with an operation mode may be shared by a memory device and a controller to dynamically change the operation mode without unnecessary memory setting time. In other words, each of the memory device and the controller according to the present disclosure may be implemented with a dual-mode structure to dynamically change a mode. Therefore, the memory system according to the present disclosure can achieve easy mode change and optimal performance.

Figure 2:
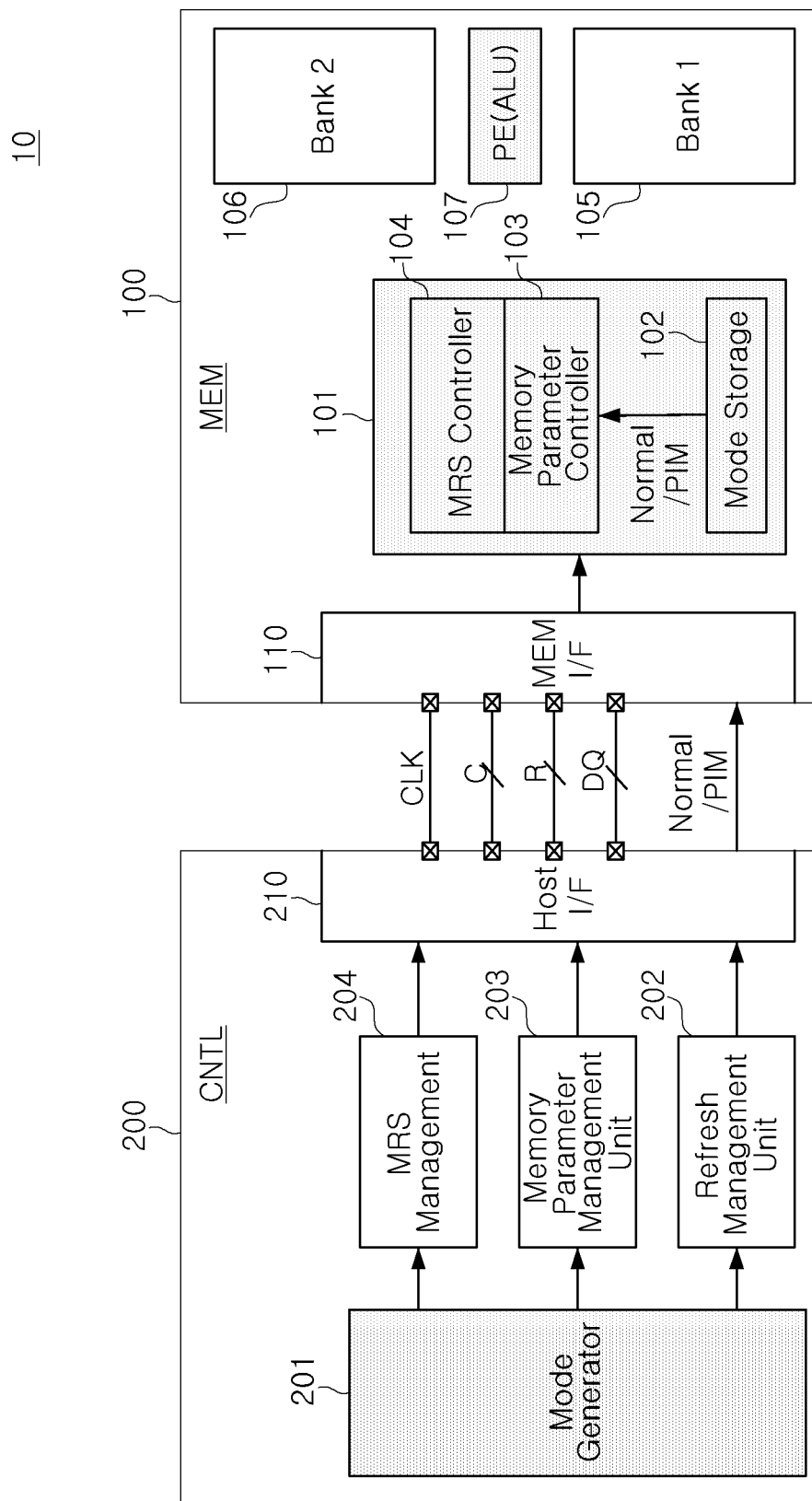
FIG. 2 is a view illustrating a memory system according to an example embodiment of the present disclosure.

FIG. 2 is a view illustrating a memory system 10 according to an example embodiment of the present disclosure. Referring to FIG. 2, the memory system 10 may include memory device (MEM) 100 and a controller (CNT) 200.

The memory system 10 may be implemented as a multi-chip package (MCP) or a system-on-chip (SoC).

The memory device 100 may be configured to store data received from the controller 200 or to output read data to the controller 200. The memory device 100 may be used as an operation memory, a working memory, or a buffer memory in a computing system. In an embodiment of the present disclosure, the memory device 100 may be a single in-line memory module (SIMM), a dual in-line memory module (DIMM), a small-outline DIMM (SODIMM), an unbuffered DIMM (UDIMM), a fully-buffered DIM (FBDIMM), a rank-buffered DIMM (RBDIMM), a mini-DIMM, a micro-DIMM, a registered DIMM (RDIMM), or a load-reduced DIMM (LRDIMM).

In an embodiment of the present disclosure, the memory device 100 may be a volatile memory. For example, the volatile memory may include at least one of a dynamic random access memory (DRAM), a synchronous DRAM (SDRAM), a double data rate SDRAM (DDR SDRAM), a low power double data rate SDRAM (LPDDR SDRAM), a graphics double data rate SDRAM (GDDR SDRAM), a Rambus DRAM (RDRAM), and a static RAM (SRAM). In another embodiment of the present disclosure, the memory device 100 may be a nonvolatile memory. For example, the nonvolatile memory may include one of a NAND flash memory, a phase-change RAM (PRAM), a magneto-resistive RAM (MRAM), a resistive RAM (ReRAM), a ferroelectric RAM (FRAM), and a NOR flash memory.

The memory device 100 may include a serial presence detect (SPD) chip. The SPD chip may be configured to store information on characteristics of the memory device 100. In an embodiment of the present disclosure, the SPD chip may store memory device information such as a module type, an operating environment, a line arrangement, a module configuration, and storage capacity of the memory device 100. In an embodiment of the present disclosure, the SPD chip may include a programmable read-only memory, for example, an electrically erasable programmable read-only memory (EEPROM). The memory device may include a NM mode controller 101, a first bank 105, a second bank 106, a processing unit PE (ALU) 107, and a memory interface circuit (MEM I/F) 110.

The PIM mode controller 101 may be configured to select mode information, indicating a normal mode (or a first operation mode) and a PIM mode (or a second operation mode), in response to control signals received through a plurality of pins and to control at least one memory parameter, at least one mode register set (MRS) value, or a refresh mode in response to the selected mode information. In addition, the PIM mode controller 101 may include a mode storage 102, a memory parameter controller 103, and an MRS controller 104.

The mode storage 102 may be configured to store one of the normal mode and the PIM mode.

The memory parameter controller 103 may be configured to vary a parameter of the memory device 100, according to an operation mode stored in the mode storage 102. The memory parameters may include an activate (ACT) to internal read or write delay time (tRCD), ACT to ACT or REF command period (tRC), ACT to ACT command delay (tRRD), four activate window (tFAW), or the like.

The MRS controller 104 may be configured to vary a mode register set (MRS) according to the operation mode stored in the mode storage 102. In this case, RL (AL+CL), write latency (WL), CAS latency (CL), a write command (WR), a row address strobe (RAS), a column address strobe (CAS), and the like, may be stored in the MRS.

One of the first bank 105 and the second bank 106 may be configured to perform a read or write operation in the normal mode. In an embodiment of the present disclosure, one of the first and second banks 105 and 106 may be activated in the normal mode.

The first bank 105 and the second bank 106 may be configured to simultaneously operate in the PIM mode. In an embodiment of the present disclosure, the first and second banks 105 and 106 may be simultaneously activated in the PIM mode. For ease of description, only two banks 105 and 106 are illustrated in FIG. 1. However, more than two banks may be provided in the memory device 100.

The processing unit PE (ALU) 107 may be configured to perform an operation on first data of the first bank 105 and second data of the second bank 106 in the PIM mode. Similarly, the processing unit PE (ALU) 107 may be configured to perform an operation on third data of a third bank and fourth data of a fourth bank.

The memory interface circuit 110 may be configured to provide interfacing with a host interface circuit 210 of the controller 200. The memory interface circuit 110 may be connected to the controller 200 through a plurality of pins. The plurality of pins may include a pin for transmitting a clock signal CLK, pins for transmitting control signals C and R, and pins for transmitting data DQ. The controller 200 may be connected to the memory device 100 through a plurality of pins, and may be configured to control the memory device 100. The controller 200 may include a mode generator 201, a refresh management unit 202, a memory parameter management unit 203, an MRS management unit 204, and the host interface circuit 210.

The mode generator 201 may be configured to generate one of the normal mode and the PIM mode using refresh-related mode information, memory parameter-related mode information, or MRS-related mode information.

The refresh management unit 202 may be configured to output the refresh-related mode information. For example, the refresh management unit 202 may output per-bank refresh (PBR) mode information, corresponding to the normal mode, and all-bank refresh (ABF) mode information corresponding to the PIM mode.

The memory parameter management unit 203 may be configured to output the memory parameter-related mode information. For example, the memory parameter management unit 203 may output memory parameter mode information, corresponding to the normal mode, and memory parameter mode information corresponding to the PIM mode.

The MRS management unit 204 may be configured to output the MRS-related mode information. For example, the MRS management unit 204 may output MRS mode information, corresponding to the normal mode, and MRS mode information corresponding to the PIM mode.

The mode generator 201, the refresh management unit 202, the memory parameter management unit 203, and the MRS management unit 204 may be collectively referred to as a mode controller. The mode controller may be implemented by a circuit.

In an embodiment of the present disclosure, the controller 200 may be configured as an additional chip or may be integrated with the memory device 100. For example, the controller 200 may be implemented on a mainboard. In addition, the controller 200 may be an integrated memory controller (IMC) included in a microprocessor. In addition, the controller 200 may be disposed in an input/output hub. In addition, the input/output hub including the controller 200 may be referred to as a memory controller hub (MCH).

In general, a PIM mode change causes an internal operation of a memory device to be changed. For example, normal reading has a read latency corresponding to the transmission of cell data to an input/output terminal in response to a read command. On the other hand, PIM reading has a read latency corresponding to the transmission of cell data to an input/output terminal in response to a read command. Since multiple banks operate simultaneously in the PIM mode, the PIM mode may vary according to an internal noise environment. For this reason, parameters associated with a core margin are dualized.

The memory system 10 according to an example embodiment of the present disclosure may change a refresh, a memory parameter, or an MRS according to a normal mode/a PIM mode. Accordingly, the memory system 10 may establish an optimal environment according to the operation mode to significantly increase PIM operation performance. In addition, the memory system 10 may initiate an operation, used to change the normal mode and the PIM mode, to prevent an invalid memory operation. In addition, the memory system 10 may prevent unnecessary settings when changing the operation mode to be expected to improve overall system performance. In addition, the memory system 10 may prevent degradation in performance of the memory device when the memory system 10 does not operate in the PIM mode.

Hereinafter, a dual mode structure of the controller 200 for dynamic mode change will be described in more detail.

Figure 3:
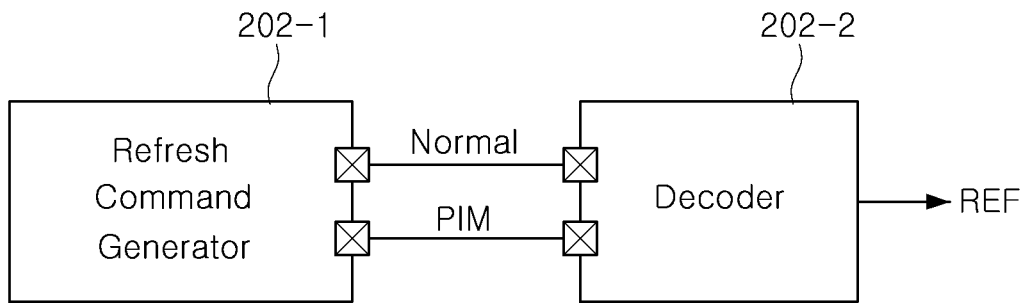
FIG. 3 is a view illustrating a refresh management unit according to an example embodiment of the present disclosure.

FIG. 3 is a view illustrating a refresh management unit 202 according to an example embodiment of the present disclosure. Referring to FIG. 3, the refresh management unit 202 may include a refresh command generator 202-1 and a decoder 202-2.

The refresh command generator 202-1 may generate a first refresh signal, corresponding to a normal mode, and a second refresh signal corresponding to a PIM mode. In an embodiment of the present disclosure, the first refresh signal and the second refresh signal may be complementary to each other. The first refresh signal and the second refresh signal may be provided to the decoder 202-2 from the refresh command generator 202-1. The first refresh signal and the second refresh signal may be output via different pins.

The decoder 202-2 may output one of the first and second refresh signals as refresh-related mode information REF.

Figure 4:
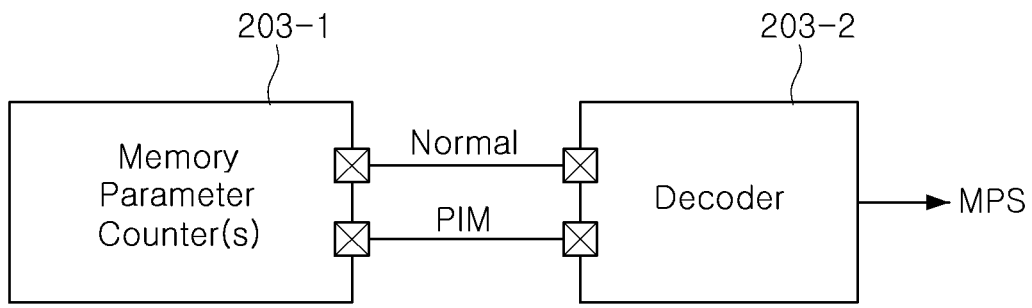
FIG. 4 is a view illustrating a memory parameter management unit according to an example embodiment of the present disclosure.

FIG. 4 is a view illustrating a memory parameter management unit 203 according to an example embodiment of the present disclosure. Referring to FIG. 4, the memory parameter management unit 203 may include a memory parameter counter 203-1 and a decoder 203-2.

The memory parameter counter 203-1 may generate a first memory parameter signal, corresponding to a normal mode, and a second memory parameter signal corresponding to a PIM mode. In an embodiment of the present disclosure, the first memory parameter signal and the second memory parameter signal may be complementary to each other.

The decoder 203-2 may output one of the first and second memory parameter signals as memory parameter-related mode information MPS. For example, the decoder 203-2 may output the memory parameter-related mode information MPS when one of the first and second memory parameter signals is received.

For ease of description, only one memory parameter counter is illustrated in FIG. 4, but it will be understood that the present disclosure is not limited thereto.

Figure 5:
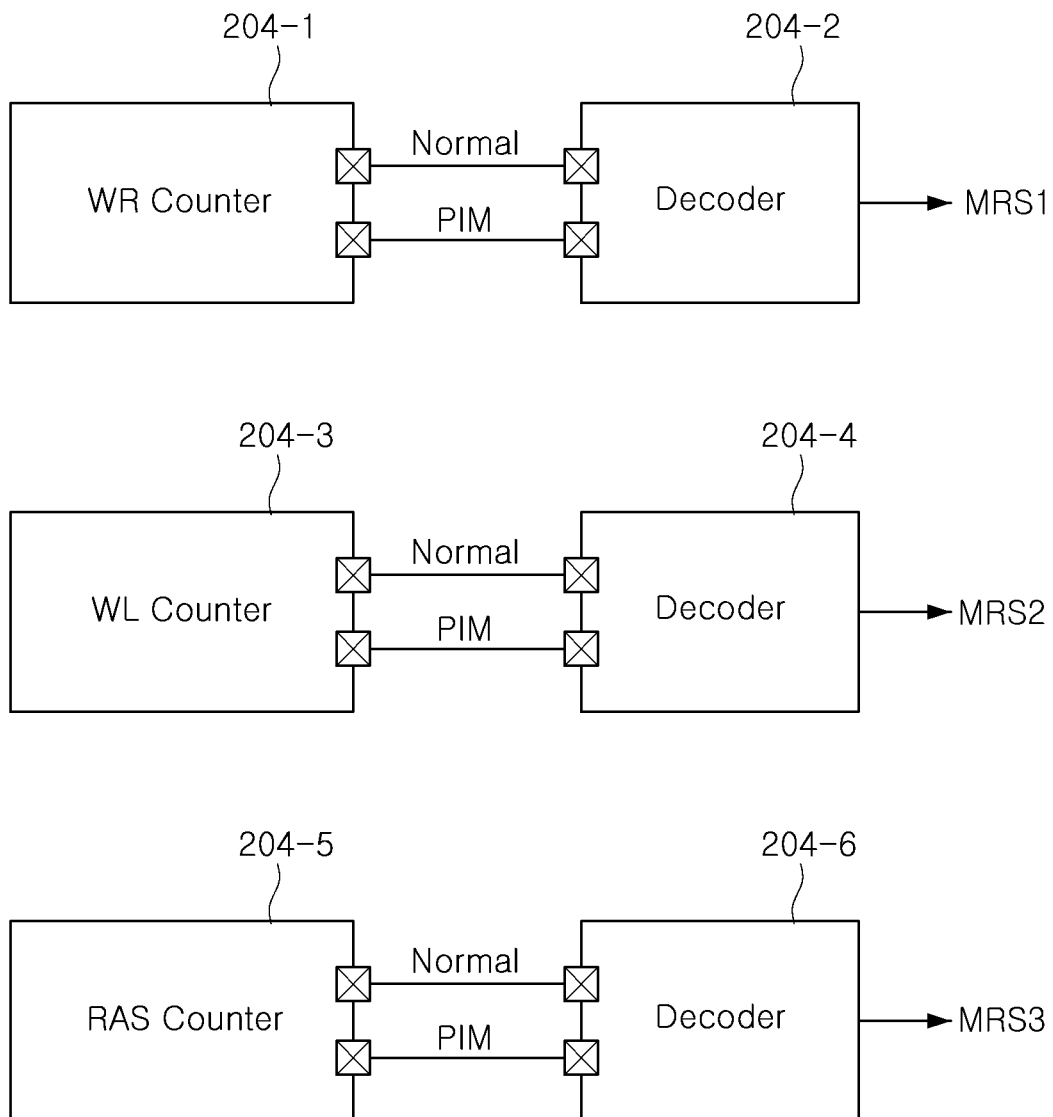
FIG. 5 is a view illustrating a mode register set management unit according to an example embodiment of the present disclosure.

FIG. 5 is a view illustrating an MRS management unit 204 according to an example embodiment of the present disclosure. Referring to FIG. 5, the MRS management unit 204 may include a WR counter 204-1, a WL counter 204-3, a RAS counter 204-5, and decoders 204-2, 204-4, and 204-6.

The WR counter 204-1 may generate a first WR signal, corresponding to a normal mode, and a second WR signal corresponding to a PIM mode. In an embodiment of the present disclosure, the first WR signal and the second WR signal may be complementary to each other. The decoder 204-2 may receive one of the first and second WR signals from the WR counter 204-1 and output one of the first and second WR signals as WR MRS-related mode information MRS1.

The WL counter 204-3 may generate a first WL signal corresponding to the normal mode and output the first WL signal through a first pin and generate a second WL signal corresponding to the PIM mode and output the second WL signal through a second pin. In an embodiment of the present disclosure, the first WL signal and the second WL signal may be complementary signals. The decoder 204-4 may output one of the first and second WL signals as WL MRS-related mode information MRS2.

The RAS counter 204-5 may generate a first RAS signal, corresponding to the normal mode, and a second RAS signal corresponding to the PIM mode. In an embodiment of the present disclosure, the first RAS signal and the second RAS signal may be complementary to each other. The decoder 204-6 may output one of the first and second RAS signals as RAS MRS-related mode information MRS3.

Although the MRS management unit 204 illustrated in FIG. 5 outputs only WR, WL, and RAS signals to the decoders 204-2, 204-4, and 204-6, it will be understood that the present disclosure is not limited thereto and other signals may be generated and provided to the decoders 204-2, 204-4, and 204-6.

The memory system 10 illustrated in FIG. 2 transmits an operation mode (the normal mode/the PIM mode) from the controller 200. However, it will be understood that the present disclosure is not limited thereto. The operation mode (the normal mode/the PIM mode) may be controlled inside the memory device. In other words, the operation mode may not be provided from the controller 200.

Figure 6:
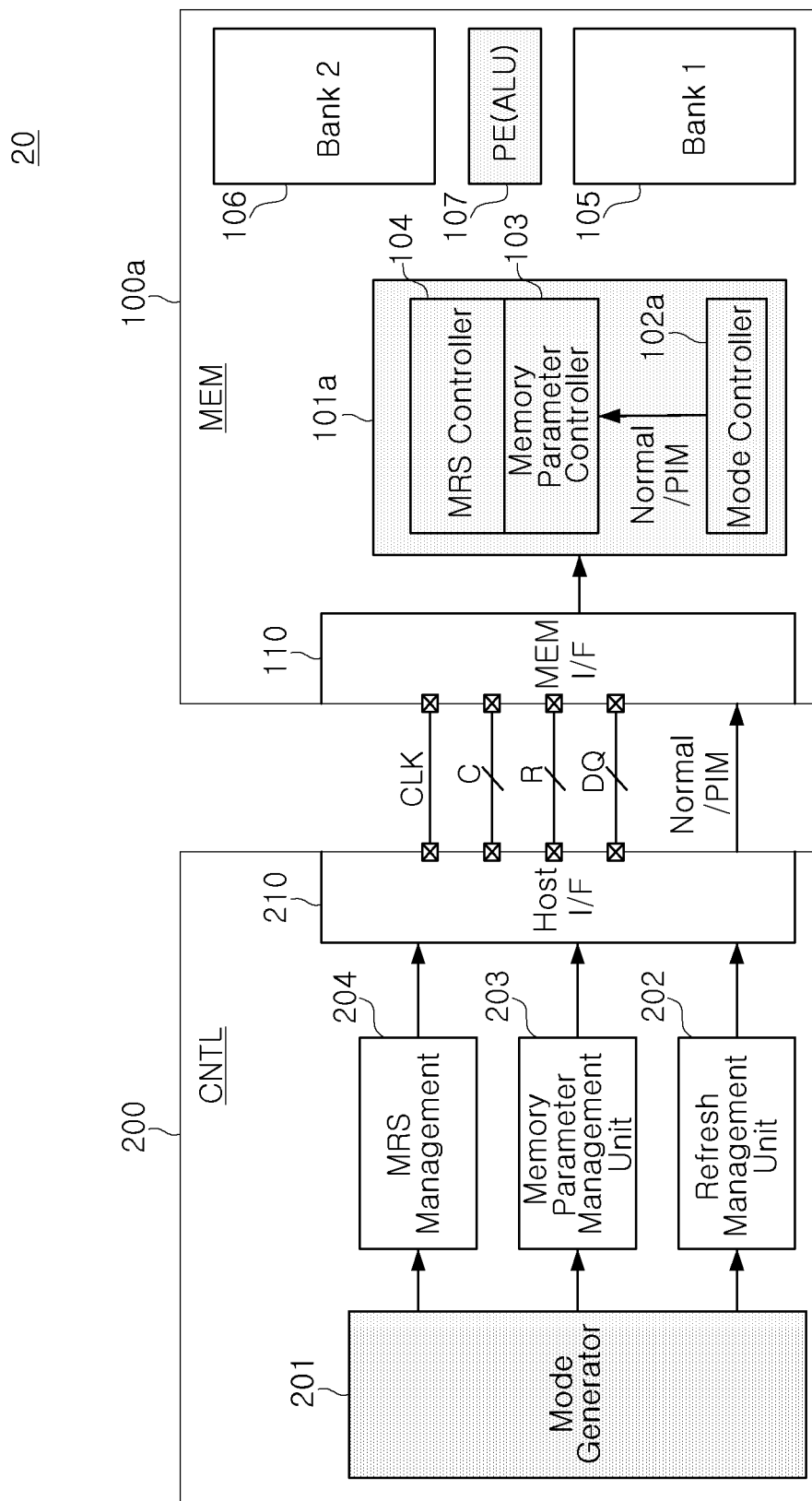
FIG. 6 is a view illustrating a memory system according to another example embodiment of the present disclosure.

FIG. 6 is a view illustrating a memory system 20 according to another example embodiment of the present disclosure. Referring to FIG. 6, the memory system 20 includes a memory device 100a for generating an operation mode. A difference between the memory system 20 of FIG. 6 and the memory system 10 of FIG. 2 lies in the memory device 100a.

The memory device 100a may include a PIM mode controller 101a, first and second banks 105 and 106, a processing unit 107, and a memory interface circuit 110. The PIM mode controller 101a may include a mode controller 102a, a memory parameter controller 103, and an MRS controller 104.

The mode controller 102a may be configured to receive an operation mode (a normal mode/a PIM mode) from a controller 200 and to control the operation mode of the memory device 100a.

In an embodiment of the present disclosure, the memory device 100a may internally precharge the first bank 105 and the second bank 106 before and after changing the operation mode of the memory device 100a. In another embodiment of the present disclosure, the controller 200 may issue an all-bank precharge command to precharge the first and second banks 105 and 106 before and after changing the operation mode of the memory device 100a.

The memory system 20 according to an example embodiment may have a structure dualized to select a first operation mode (for example, a normal mode) and a second operation mode (for example, a PIM mode). During a mode change, a corresponding signal may change from a 'low' level to a 'high' level. It will be understood that the mode change of the present disclosure is not limited thereto.

Figure 7:
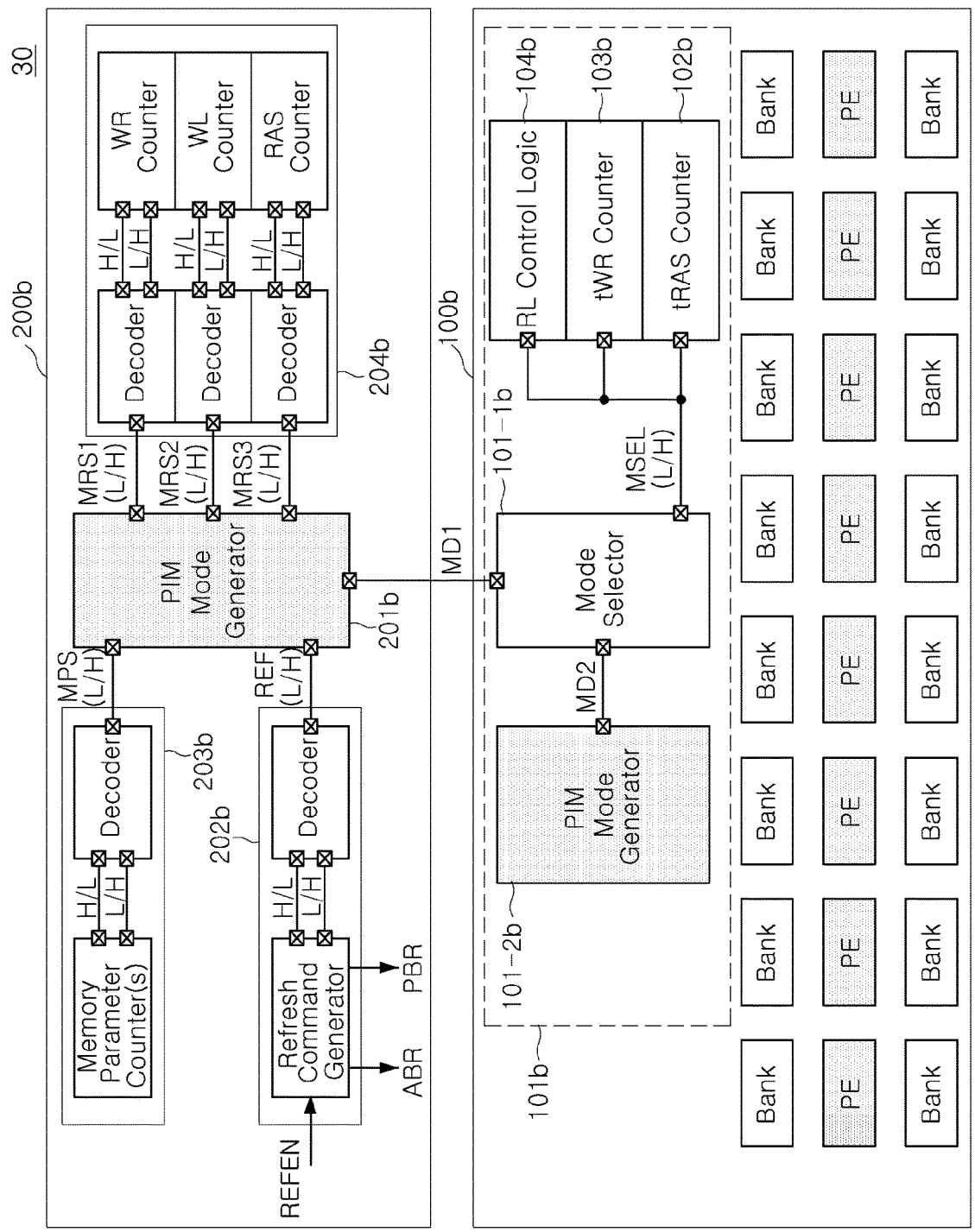
FIG. 7 is a view illustrating a memory system according to another example embodiment of the present disclosure.

FIG. 7 is a view illustrating a memory system according to another example embodiment of the present disclosure.

Referring to FIG. 7, the memory system 30 may include a memory device 100b and a controller 200b.

The memory device 100b may include a PIM mode controller 101b, first banks, second banks, and processing units PE. The PIM mode controller 101b may include a mode selector 101-1b, a PIM mode generator 101-2b, a tRAS counter 102b, a tWR counter 103b, and an RL control logic 104b.

The mode selector 101-1b of the memory device 100b may receive first operation mode information MD1 (for example, a mode change command) from the PIM mode generator 201b of the controller 200b or receive second operation mode information MD2 from the PIM mode generator 101-2b of the memory device 100, and, in response thereto, may select whether or not to operate in the first operation mode or the second operation mode. For example, the mode selector 101-1b may output a mode selection signal MSEL having a low level L corresponding to the first operation mode, or may output a mode selection signal MSEL having a high level H corresponding to the second operation mode. The mode selector 101-1b and the PIM mode generator 101-2b may be referred to as a PIM mode controller.

Each of the tRAS counter 102b, tWR counter 103b, and RL control logic 104b may determine whether or not to operate in the first operation mode or the second operation mode in response to the mode selection signal MSEL.

The PIM mode generator 201b of the controller 200b may receive a refresh signal REF, at least one memory parameter signal MPS, and a plurality of MRS signals MRS1, MRS2, and MRS3, and may receive one of the first and second operation modes and generate first operation mode information MD1 corresponding to the selected mode.

The refresh management unit 202b may output a refresh signal. REF having a low level L corresponding to the first operation mode or a refresh signal REF having a high level H corresponding to the second operation mode. The refresh command generator 202-1b may output an all-bank refresh command ABR or a per-bank refresh command RBR in response to a refresh activation signal. The refresh activation signal may be REFEN.

The memory parameter management unit 203b may output at least one memory parameter signal MPS having a low level L corresponding to the first operation mode, or at least one parameter signal MPS having a high level H corresponding to the second operation mode.

The MRS management unit 204b may output MRS signals MRS1 to MRS3 having a low level L corresponding to the first operation mode, or MRS signals MRS1 to MRS3 having a high level H corresponding to the second operation mode.

It will be understood that the tRAS counter 102b, tWR counter 103b, and RL control logic 104b illustrated in FIG. 7 are only examples. There may be various factors, which are mode-selectable by the mode selection signal MSEL, other than tRAS, tWR, and RL.

The following table illustrates examples of a mode change.

TABLE 1

| Factors | Mode 1 | Mode 2 |
| --- | --- | --- |
| Refresh | Per Bank Refresh | All Bank Refresh |
| tRCD/tRAS | 15 ns/33 ns | 20 ns/38 ns |
| RL | 20 | 10 |

In the first operation mode, a refresh operation may by a per-bank refresh operation, tRCD may be 15 ns, tRAS may be 33 ns, and RL may be 20. In the second operation mode, the refresh operation may operate an all-bank refresh, tRCD may be 20 ns, tRAS may be 38 ns, and RL may be 10. It will be understood that the above-mentioned values of the first and second operation modes are only example values.

In the first operation mode, the memory device 100b may perform normal read/write operations on a plurality of banks. In the second operation mode, the memory device 100b may perform predetermined internal operations (for example, an XOR operation, a convolution operation, an encryption/decryption operation, and the like) on the first and second banks.

In an embodiment of the present disclosure, in the second operation mode, the first bank and the second bank may be simultaneously activated. In another embodiment of the present disclosure, in the second operation mode, the first bank and the second bank may be activated at different points in time.

The memory system according to an example embodiment of the present disclosure may transmit mode information in the form of a command.

Figure 8:
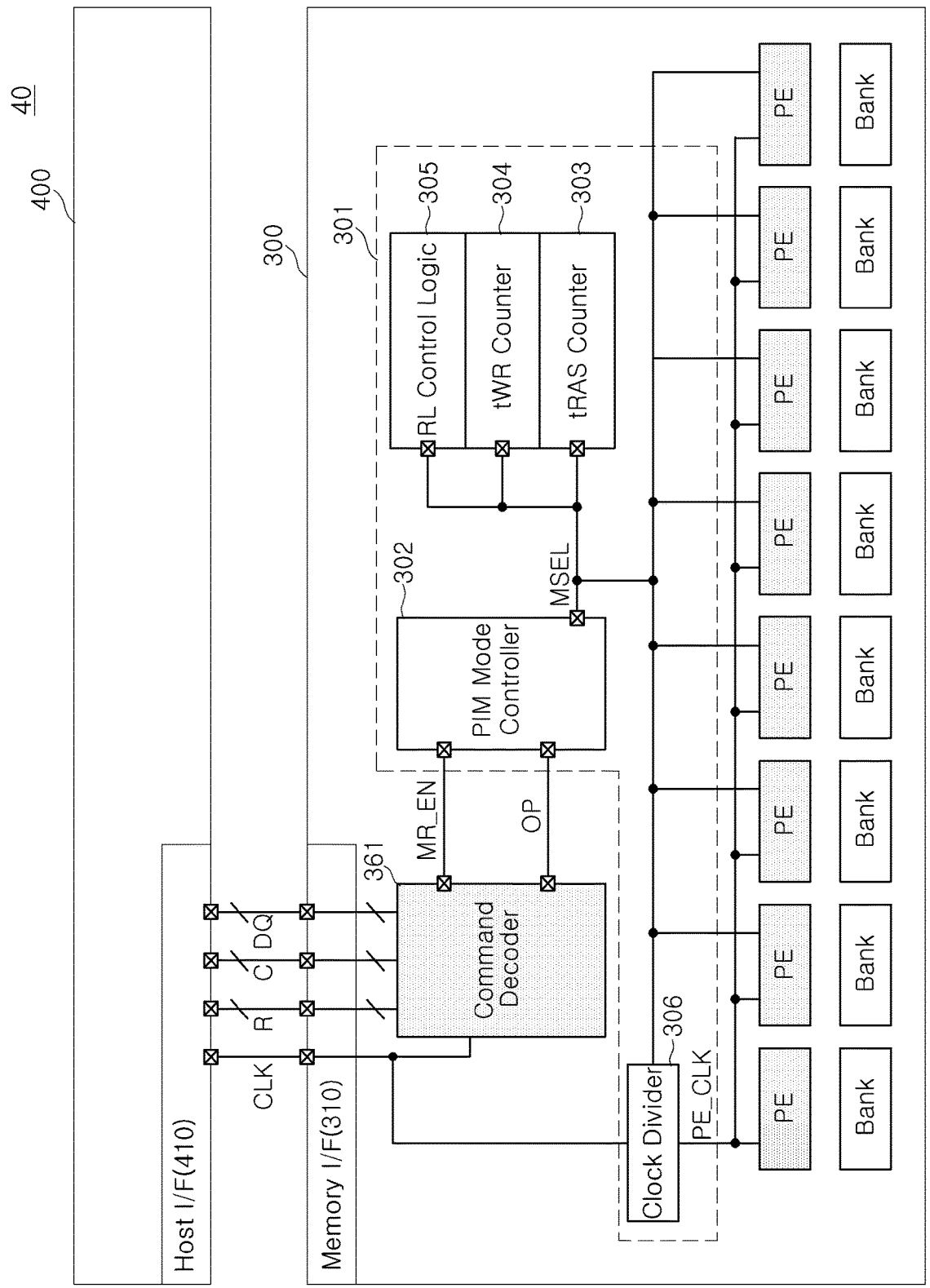
FIG. 8 is a view illustrating a memory system according to another example embodiment of the present disclosure.

FIG. 8 is a view illustrating a memory system 40 according to another example embodiment of the present disclosure. Referring to FIG. 8, the memory system 40 may include a memory device 300 and a controller 400. The memory device 300 and the controller 400 may transmit and receive mode information through corresponding interface circuits 310 and 410. In FIG. 8, a clock signal CLK, a row address signal R, a column address signal C, and a data signal DQ are illustrated for ease of description. It will be understood that a variety of other signals may be transmitted between the interface circuits 310 and 410.

The PIM mode controller 302 may receive a mode register enable signal MR_EN and an operation code OP from a command decoder 361 and may output a mode selection signal MSEL. A tRAS counter 303, a tWR counter 304, and an RL control logic 305 may determine whether or not to operate in a normal mode or a PIM mode, in response to the mode selection signal MSEL. A clock divider 306 may be configured to receive a clock signal CLK and to output an operation clock signal PE_CLK appropriate to a processing unit PE. In an embodiment of the present disclosure, the operation clock signal PE_CLK may have a lower frequency than the clock signal CLK. The PIM mode controller 302, tRAS counter 303, tWR counter 304, and RL control logic 305, and the clock divider 306 may constitute a single intellectual property (IP), and thus, may be referred to as a PIM mode controller 301.

The command decoder 361 may receive a clock signal CLK, control signals R and C, and a data signal DQ and may decode the received control signals R and C and the received data signal DQ to determine an operation mode. The command decoder 361 may output an operation code OP and a mode register enable signal MR_EN corresponding to an operation mode.

FIG. 9 is a view illustrating an example of an operation code OP illustrated in FIG. 8. Referring to FIG. 9, in a default mode (a normal mode), the operation code OP may be '0000000X,' where X is any value. When all banks enter a PIM mode, the operation code OP may be '1100101X.' When only banks 0 to 7 enter the PIM mode, the operation code OP may be '0110101X.' When all banks exit the PIM mode, the operation code OP may be '1101010X.'

Figure 10:
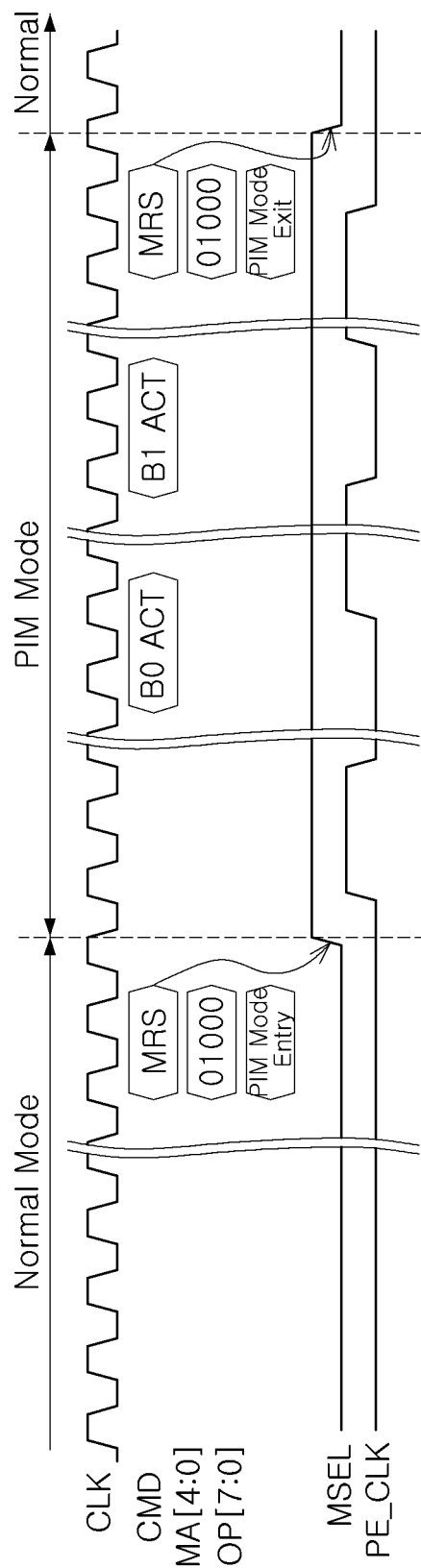
FIG. 10 is a view illustrating timings associated with a mode change of a memory system according to an example embodiment of the present disclosure.

FIG. 10 is a view illustrating timings associated with a mode change of a memory system according to an example embodiment of the present disclosure. Referring to FIG. 10, when a mode change command MRS, a memory array MA[4:0], and an operation code OP[7:0] are received during a normal mode operation, a mode selection signal MSEL indicating a PIM mode may change from a low level to a high level in response to the mode change command MRS. At the same time, an internal operation clock signal PE_CLK obtained by dividing the clock signal CLK may be generated.

In an embodiment of the present disclosure, in the PIM mode, a first bank and a second bank may be activated in response to a first bank activation command B0 ACT and a second bank activation command B1 ACT. In an embodiment of the present disclosure, banks in which the memory array MA[4:0] corresponding to '01000' may enter the PIM mode. In an embodiment of the present disclosure, banks may enter or exit the PIM mode in response to the operation code OP[7:0].

In FIGS. 8 to 10, a mode change is performed by a mode change command. However, the present disclosure is not necessarily limited thereto. Mode information of the present discourse may be transmitted in various combinations by different control signals. For example, the mode change may be performed by an active command ACT and a precharge command PRE.

Figure 11:
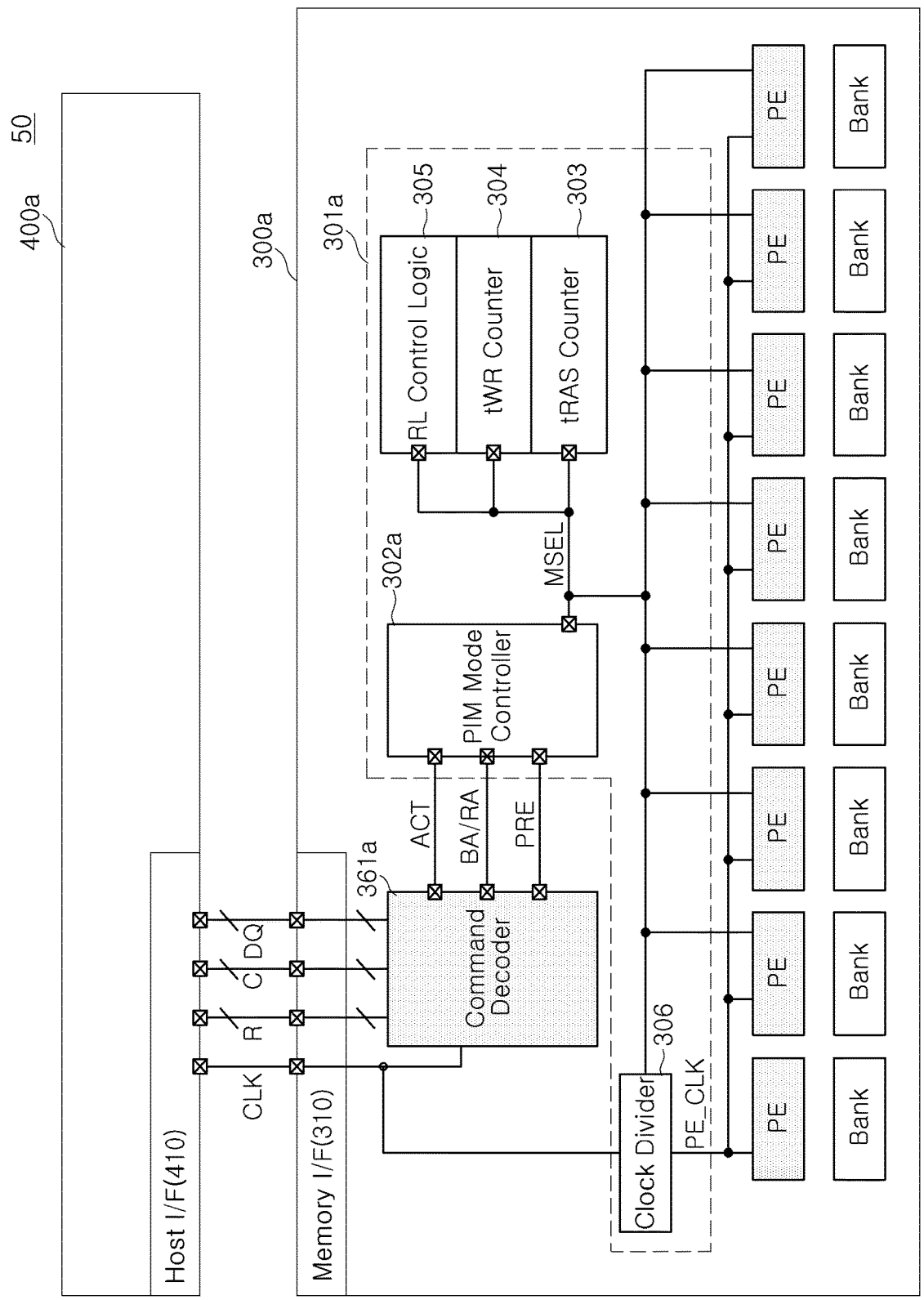
FIG. 11 is a view illustrating a memory system according to another example embodiment of the present disclosure.

FIG. 11 is a view illustrating a memory system 50 according to another example embodiment of the present disclosure. Referring to FIG. 11, the memory system 50 may include a memory device 300a and a controller 400a.

The memory device 300a may perform a mode change using an active signal ACT and a precharge signal PRE. Unlike the command decoder 361 illustrated in FIG. 8, a command decoder 361a of the memory device 300a may use an active signal ACT, a bank address/a row address BA/RA, and a precharge signal PRE to perform a mode change.

A PIM mode controller 302a, a tRAS counter 303, a tWR counter 304, and an RL control logic 305, and a clock divider 306 may constitute a single intellectual property (IP), and thus, may be referred to as a PIM mode controller 301a.

Figure 12:
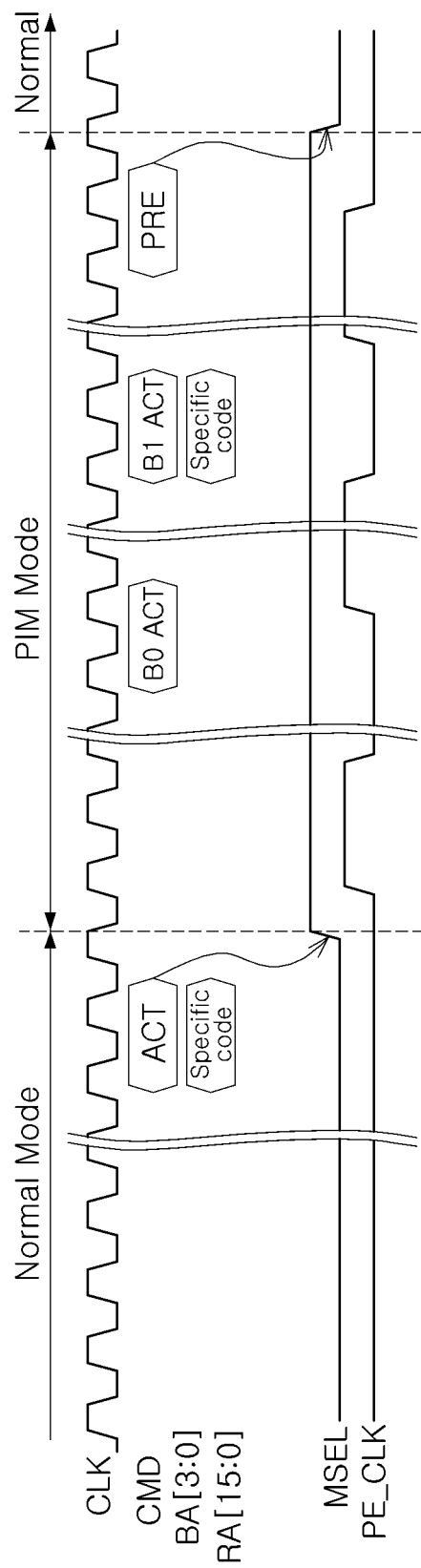
FIG. 12 is a view illustrating timings associated with a mode change of the memory system illustrated in FIG. 11.

FIG. 12 is a view illustrating timings associated with a mode change of the memory system 50 illustrated in FIG. 11. Referring to FIG. 12, a PIM mode entry may be made using an RA/BA code (e.g., a specific code) and an active command ACT. In addition, a PIM mode exit may be made by a combination of a predetermined RA/BA code, an active command ACT, and a precharge command PRE of the same BA. In addition, the clock PE_CLK supplied to the processing unit PE can be controlled (on/off) using the signal MSEL generated by the internal PIM mode controller. A specific code may be transmitted by BA[3:0] and RA[15:0] to perform mode setting.

Figure 13:
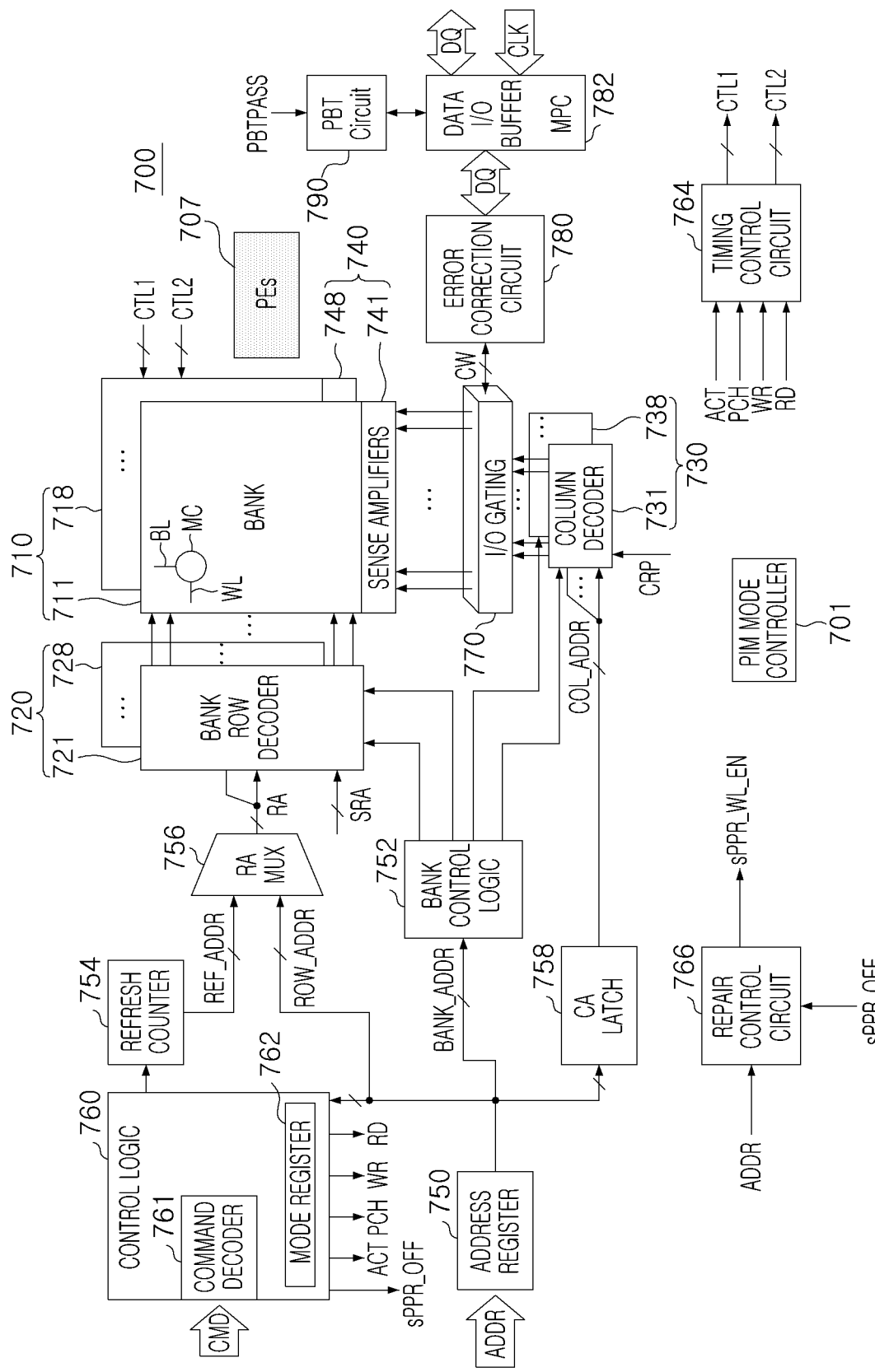
FIG. 13 is a view illustrating a memory device according to an example embodiment of the present disclosure.

FIG. 13 is a view illustrating a memory device 700 according to an example embodiment of the present disclosure.

Referring to FIG. 13, the memory device 700 may include a PIM mode controller 701, a plurality of processing units (PEs) 707, a memory cell array 710, a row decoder 720, a column decoder 730, a sense amplifier circuit 740, an address register 750, a bank control logic 752, a refresh counter 754, a row address multiplexer 756, a column address latch 758, a control logic 760, a repair control circuit 766, a timing control circuit 764, an input/output gating circuit 770, an error correction circuit 780, a data input/output buffer 782, and a PBT circuit 790.

The PIM mode controller 701 may control an operation mode of the memory device 700 to dynamically change to a normal mode or a PIM mode, as described with reference to FIGS. 1 to 12.

Each of the processing units (PEs) 707 may be configured to perform an operation of banks activated in the PIM mode.

The memory cell array 710 may include first to eighth banks 711 to 718. It will be understood that the number of banks of the memory cell array 710 is not limited thereto. For example, fewer or more than eight banks may be included in the memory cell array 710.

The row decoder 720 may include first to eighth bank row decoders 721 to 728, respectively connected to the first to eighth banks 711 to 718.

The column decoder 730 may include first to eighth bank column decoders 731 to 738, respectively connected to the first to eighth banks 711 to 718.

The sense amplifier circuit 740 may include first to eighth bank sense amplifiers 741 to 748, respectively connected to the first to eighth banks 711 to 718.

The first to eighth banks 711 to 718, the first to eighth bank row decoders 721 to 728, the first to eighth bank column decoders 731 to 738, and the first to eighth bank sense amplifiers 741 to 748 may constitute first to eighth banks, respectively. Each of the first to eighth banks 711 to 718 may include a plurality of memory cells MC formed at intersections of wordlines WL and bit lines BL.

The address register 750 may receive and store an address ADDR having a bank address BANK_ADDR, a row address ROW_ADDR, and a column address COL_ADDR from an external memory controller. The address register 750 may provide the received bank address BANK_ADDR to the bank control logic 752, may provide the received row address ROW_ADDR to the row address multiplexer 756, and may provide the received column address COL_ADDR to the column address latch 758.

The bank control logic 752 may generate bank control signals in response to the bank address BANK_ADDR. Among the first to eighth bank row decoders 721 to 728, a bank row decoder corresponding to the bank address BANK_ADDR may be activated in response to the bank control signals. Among the first to eighth bank column decoders 731 to 738, a bank column decoder corresponding to the bank address BANK_ADDR may be active in response to the bank control signals.

The row address multiplexer 756 may receive the row address ROW_ADDR from the address register 750 and may receive a refresh row address REF_ADDR from the refresh counter 754. The row address multiplexer 756 may selectively output the row address ROW_ADDR or the refresh row address REF_ADDR as a row address RA. The row address RA, output from the row address multiplexer 756, may be applied to each of the first to eighth bank row decoders 721 to 728.

Among the first to eighth bank row decoders 721 to 728, a bank row decoder activated by the bank control logic 752 may decode the row address RA, output from the row address multiplexer 756, to activate a wordline corresponding to a row address. For example, the activated bank row decoder may apply a wordline driving voltage to a wordline corresponding to a row address. In addition, the activated bank row decoder may activate a redundancy wordline corresponding to a redundancy row address output from the repair control circuit 766, simultaneously with activation of the wordline corresponding to the row address.

The column address latch 758 may receive a column address COL_ADDR from the address register 750 and may temporarily store the received column address COL_ADDR. The column address latch 758 may gradually increase the received column address COL_ADDR in a burst mode. The column address latch 758 may apply the temporarily stored or gradually increased column address COL_ADDR to each of the first to eighth bank column decoders 731 to 738.

Among the first to eighth bank column decoders 731 to 738, a bank column decoder activated by the bank control logic 752 may activate a sense amplifier corresponding to the bank address BANK_ADDR and the column address COL_ADDR through the input/output gating circuit 770. In addition, the activated bank column decoder may perform a column repair operation in response to the column repair signal CRP output from the repair control circuit 766.

The control logic 760 may be configured to control an operation of the memory device 700. For example, the control logic 760 may generate control signals such that the semiconductor memory device 700 performs a write operation or a read operation. The control logic 760 may include a command decoder 761, configured to decode a command CMD received from the memory controller, and a mode register or mode register set 762 configured to set an operation mode of the memory device 700.

For example, the command decoder 761 may decode a write enable signal/WE, a row address strobe signal/RAS, a column address strobe signal/CAS, a chip select signal/CS, and the like, to generate operation control signals ACT, PCH, WE, and RD corresponding to a command CMD. The control logic 760 may provide the operation control signals ACT, PCH, WE, and RD to the timing control circuit 764. The operation control signals ACT, PCH, WR, and RD may include an active signal ACT, a precharge signal PCH, a write signal WR, and a read signal RD. The timing control circuit 764 may generate first control signals CTL1, controlling a voltage level of a wordline WL in response to the operation control signals ACT, PCH, WR, and RD, and second control signals CTL2 controlling a voltage level of a bitline BL in response to the operation control signals ACT, PCH, WR, and RD, and may provide the first control signals CTL1 and the second control signals CTL2 to the memory cell array 710.

The repair control circuit 766 may generate repair control signals CRP and SRP for controlling a repair operation of at least one first cell region and a second cell region of banks, based on a row address ROW_ADDR and a column address COL_ADDR of an address ADDR (or an access address) and fuse information of respective wordlines. The repair control circuit 766 may provide a redundancy row address to a corresponding bank row decoder, may provide a column repair signal CRP to a corresponding bank column decoder, and may provide a selected signal and an enable signal SRA to a block control circuit associated with a corresponding redundancy array block. For example, the enable signal SRA may be provided to the row decoder 720.

The repair control circuit 766 may generate an hPPR wordline enable signal in response to the address ADDR in an hPPR mode stored in the mode register set 762. In addition, the repair control circuit 766 may generate sPPR wordline enable signal sPPR_WL_EN in response to the address ADDR in an sPPR mode stored in the mode register set 762. In addition, the repair control circuit 766 may turn off an sPPR logic in an sPPR_OFF mode stored in the mode register set 762, and may generate a normal wordline enable signal to access previous data. In an embodiment of the present disclosure, the repair control circuit 766 may change a repair unit based on the address ADDR and the fuse information. For example, the repair control circuit 766 may vary the type and number of repair address bits based on the address ADDR and the fuse information.

The input/output gating circuit 770 may include input/output gating circuits. Together with circuit gating input/output data, each of the input/output gating circuits may include input data mask logic, data latches configured to store data output from the first to eighth banks 711 to 718, and write drivers configured to write data to the first to eighth banks 711 to 718.

A codeword CW to be read from one of the first to eighth banks 711 to 718 is sensed by a sense amplifier corresponding to the one bank, and may be stored in read data latches. The codeword CW, stored in the read data latches, may be provided to a memory controller through the data input/output buffer 782 after ECC decoding is performed by the error correction circuit 780. Data DQ to be written to one of the first to eighth banks 711 to 718 may be written to the one bank through the write drivers after the ECC encoding is performed by the error correction circuit 780.

The data input/output buffer 782 may provide data DQ to the error correction circuit 780, based on the clock signal CLK provided from the memory controller during a write operation, and may provide the data DQ provided from the error correction circuit 780 to the memory controller during a read operation.

The error correction circuit 780 may generate parity bits based on data bits of the data DQ provided from the data input/output buffer 782 during the write operation and may provide a codeword CW including the data DQ and the parity bits to the input/output gating circuit 770, and the input/output gating circuit 770 may write the code word to a bank, e.g., one of the first to eighth banks 711 to 718.

In addition, the error correction circuit 780 may receive the codeword CW read from one bank from the input/output gating circuit 770 during the read operation. The error correction circuit 780 may perform ECC decoding on the data DQ using the parity bits, included in the read codeword CW, to correct at least one error bit included in the data DQ and to provide the corrected error bit to the data input/output buffer 782.

The PBT circuit 790 may be configured to perform a parallel test operation on test data TDATA, received from the controller 200 (see FIG. 2), and each of the banks, to perform a repair operation when an error is correctable, and to output a result value based on a result thereof.

In addition, the PBT circuit 790 may be configured to pass a bank in response to a test pass signal PBTPASS, irrespective of a result value of a test operation of a corresponding bank. In an embodiment of the present disclosure, the test pass signal PBTPASS may be output from the mode register set 762 during a parallel bit test operation.

Even when the memory device 700 according to an example embodiment of the present disclosure includes a bank which is uncorrectable using the repair control circuit 766, the memory device 700 may perform mask processing on an output terminal of the repair-uncorrectable bank in response to the test pass signal PBTPASS. Thus, the memory device 700 may control an output terminal of each bank, allowing a defective chip to operate as a good chip.

Figure 14:
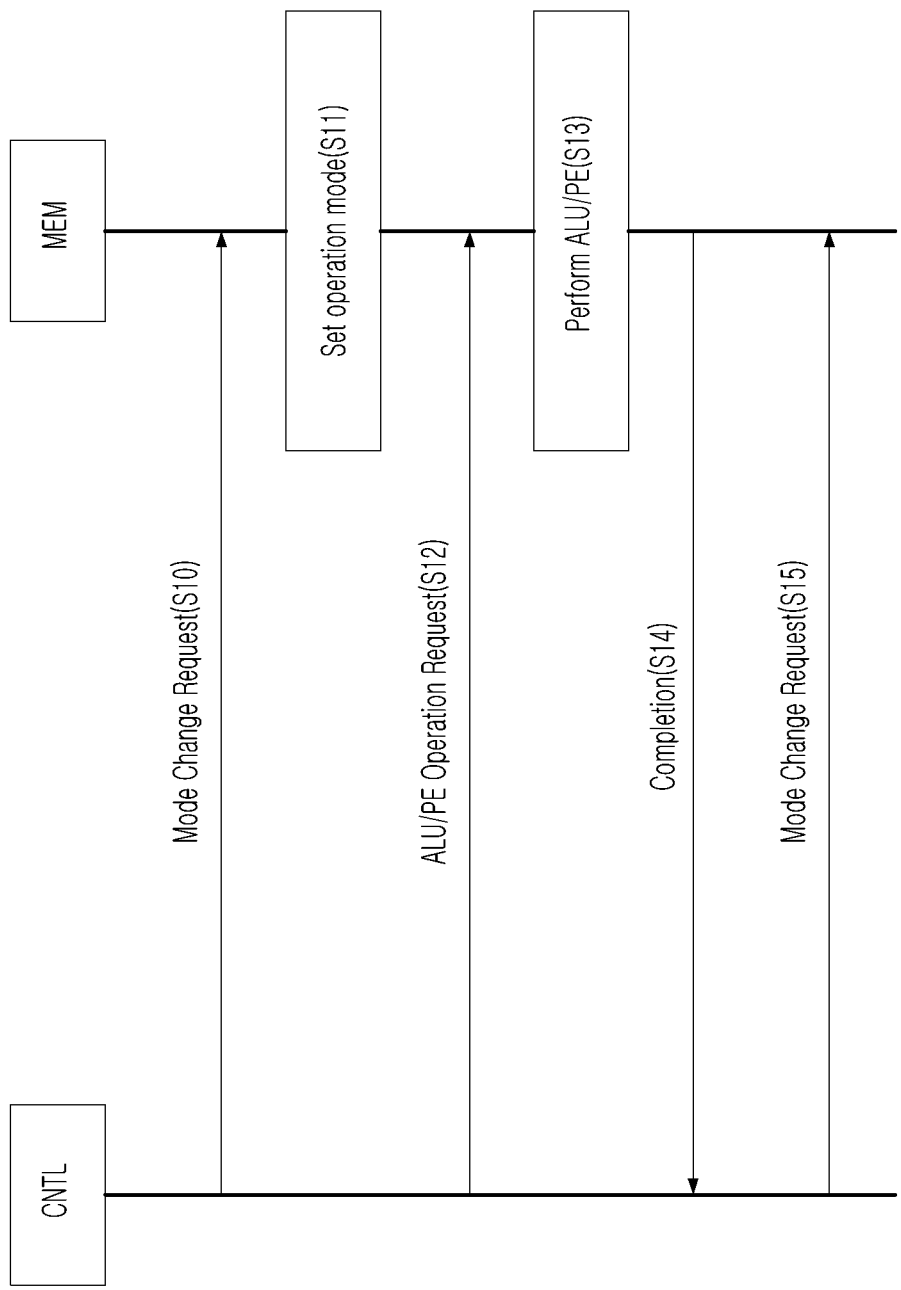
FIG. 14 is a ladder diagram illustrating an internal operation process of a memory device according to an example embodiment of the present disclosure.

FIG. 14 is a ladder diagram illustrating an internal operation process of a memory device according to an example embodiment of the present disclosure. Hereinafter, an internal operation process of the memory device MEM will be described with reference to FIGS. 1 to 14.

The memory device MEM may receive a mode change request from the controller CNTL (S10). In an embodiment of the present disclosure, the mode change request may include a mode change command. In another embodiment of the present disclosure, the mode change request may include mode information corresponding to a combination of a plurality of control signals.

The memory device MEM may set an operation mode of the memory device MEM in response to a mode change request for changing the operation mode (S11). For example, in S11, the operation mode may be set to the PIM mode in response to a mode change request for changing the operation mode from a normal mode to the PIM mode. The memory device MEM may receive an internal operation request from the controller CNTL (S12). The memory device MEM may perform an internal operation in response to the internal operation request (S13). After the internal operation is completed, the memory device MEM may transmit completion information to the controller CNTL (S14).

The memory device MEM may receive a mode change request for changing the operation mode from the PIM mode to the normal mode from the controller CNTL (S15).

In an embodiment of the present disclosure, the mode change request may include information for changing a set value of a mode register set (MRS). In an embodiment of the present disclosure, the changing of the operation mode may include changing an MRS-related operation code value in response to the mode change request. In an embodiment of the present disclosure, the mode change request may include an active command and a precharge command. In an embodiment of the present disclosure, a clock may be received from a controller, and the received clock may be divided to generate an internal operation clock.

Figure 15:
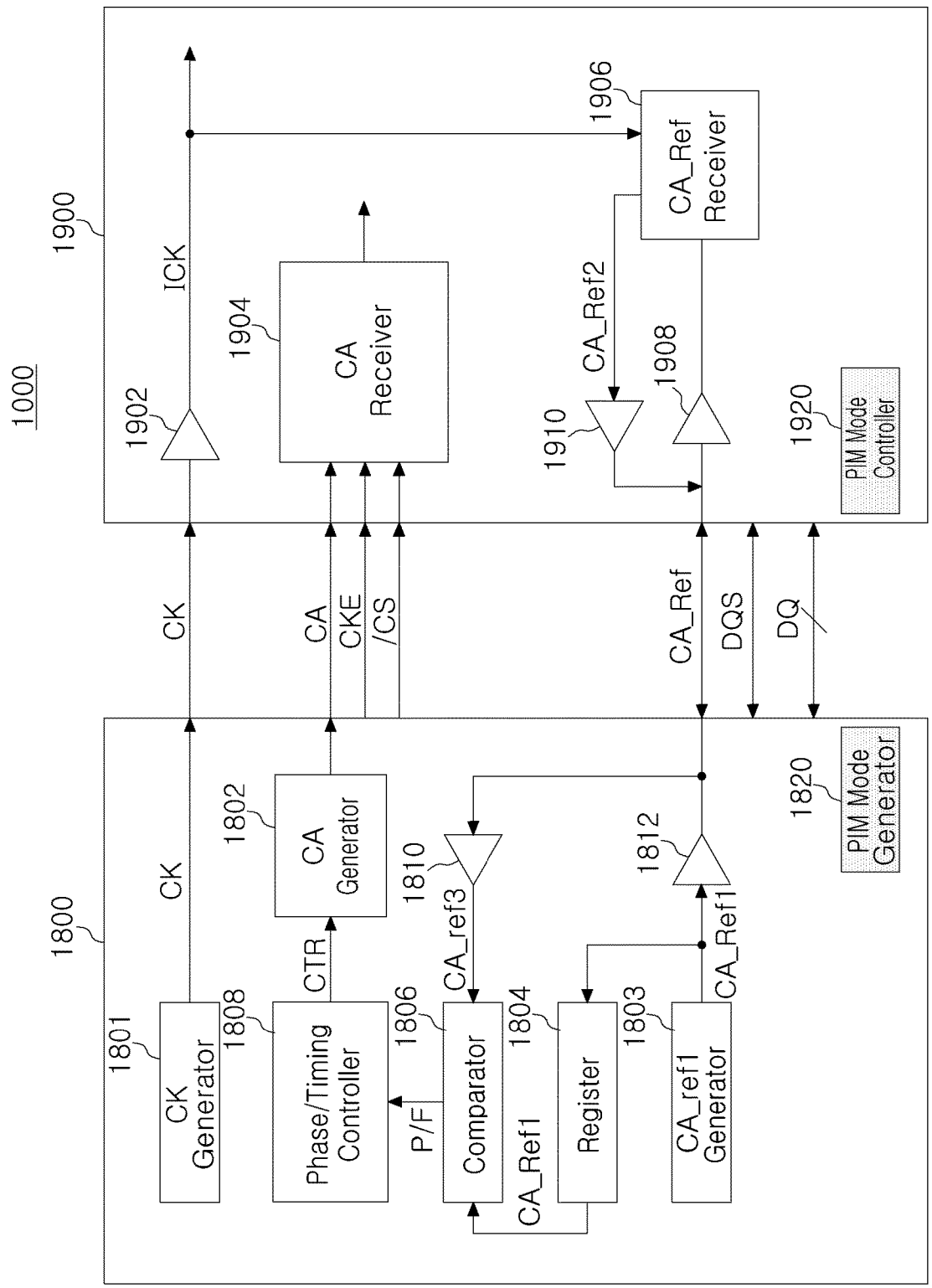
FIG. 15 is a view illustrating a memory system performing at least one command/address calibration according to an example embodiment of the present disclosure.

FIG. 15 is a view illustrating a memory system performing at least one command/address calibration according to an example embodiment of the present disclosure.

Referring to FIG. 15, a memory system 1000 may include a controller 1800 and a memory device 1900. The controller 1800 may include a clock generator 1801, a command/address (CA) generator 1802, a command/address reference generator 1803, a register 1804, a comparator 1806, a phase/timing controller 1808, and data input/output units 1810 and 1812. The controller 1800 may provide a clock signal CK, generated by the clock generator 1801, to the memory device 1900 through a clock signal line.

In an embodiment of the present disclosure, the memory system 1000 may include an additional reference signal (CA_Ref) line of a command/address in an interface. The reference signal (CA_Ref) line of the command/address may be used to transmit and receive a reference signal CA_Ref of the command/address, and/or a reference value of the command/address, in a calibration mode.

A calibration result value using the reference value of the command/address may be provided to the phase/timing controller 1808 to adjust phase/timing of the command/address signal CA. Due to the additional command/address reference signal (CA_Ref) line, a calibration operation may be performed to adjust phase/timing of the command/address CA while performing an operation of transmitting the command/address (CA) signal.

The CA generator 1802 may generate a command/address signal CA having a phase or timing adjusted in response to a control signal CTR of the phase/timing controller 1808, and may transmit the command/address signal CA to the memory device 1900 through a CA bus.

The command/address reference generator 1803 may be configured the same as the command/address generator 1802, and may generate a first command/address reference signal CA_Ref1, the same signal as the command/address signal CA generated from the command/address generator 1802.

A first command/address reference signal CA_Ref1 may be provided to the register 1804. In addition, the first command/address reference signal CA_Ref1 may be transmitted to a CA reference bus through the data output unit 1812 and provided to the memory device 1900 through the CA reference bus.

The register 1804 may store the first command/address reference signal CA_Ref1 The comparator 1806 may compare the first command/address reference signal CA_Ref1, stored in the register 1804, with a third command/address reference signal CA_Ref3 output from the data input unit 1810. The comparator 1804 may compare data of the first command/address reference signal CA_Ref1 with data of the third command/address reference signal CA_Ref3 to generate a pass or fail signal P/F.

The phase/timing controller 1808 may generate a control signal CTR indicating a phase shift of the command/address signal CA according to the pass or fail signal P/F of the comparator 1806. The control signal CTR may adjust the phase or timing of the command/address signal CA to generate a phase-adjusted command/address signal CA.

The data input unit 1810 may receive a second command/address reference signal CA_Ref2, transmitted through the CA reference bus, from the memory device 1900 and may transmit the received second command/address reference signal CA_Ref2 to the comparator 1806 as the third command/address reference signal CA_Ref3.

The data output unit 1812 may receive the first command/address reference signal CA_Ref1, generated by the command/address reference generator 1803, and transmit the received first command/address reference signal CA_Ref1 to the CA reference bus.

The memory device 1900 may include a clock buffer 1902, a command/address (CA) receiver 1904, a command/address reference receiver 1906, and data input/output units 1908 and 910. The clock buffer 1902 may receive a clock signal CK, transmitted through a clock signal line, to generate an internal clock signal ICK. The CA receiver 1904 may receive a chip select signal/CS, a clock enable signal CKE, and a command/address signal CA, transmitted through a CA bus, in response to the internal clock signal ICK.

A clock enable signal CKE may be used as a pseudo command acting as a read command of the command/address signal CA transmitted through the CA bus. The CA receiver 1904 may receive the command/address signal CA when the clock enable signal CKE is enabled.

The data input unit 1908 may receive the first command/address reference signal CA_Ref1, transmitted from the controller 1800 through the CA reference bus, and may transmit the received first command/address reference signal CA_Ref1 to the command/address reference receiver 1906. The command/address reference receiver 1906 may be configured the same as the CA receiver 1904. The command/address reference receiver 1906 may use a chip select signal/CS, a clock enable signal CKE, and a first command/address reference signal CA_Ref1, transmitted through the CA reference bus, in response to the internal clock signal ICK to generate the second command/address reference signal CA_Ref2.

The second command/address reference signal CA_Ref2 may the same as a signal output by the CA receiver 1904 receiving the chip select signal/CS, the clock enable signal CKE, and the command/address signal CA, transmitted through the CA bus, in response to the internal clock signal ICK. The second command/address reference signal CA_Ref2 may be transmitted to the CA reference bus through the data output unit 1910.

Hereinafter, CA calibration performed by the memory system 1000 will be described. The CA generator 1802 of the controller 1800 may adjust phase or timing of the command/address signal CA in response to the control signal CTR of the phase/timing controller 1808, and may transmit the phase-adjusted or timing-adjusted command/address signal CA to the CA bus. The command/address reference generator 1803 may generate a first command/address reference signal CA_Ref1, which is the same signal as the command/address signal CA, and may transmit the first command/address reference signal CA_Ref1 to the CA reference bus.

The CA reference receiver 1906 of the memory device 1900 may receive the first command/address reference signal CA_Ref1 according to the internal clock signal ICK and the clock enable signal CKE to generate the second command/address reference signal CA_Ref2. The second command/address reference signal CA_Ref2 of the memory device 1900 may be transmitted through the CA reference bus.

The memory device 1900 may transmit the second command/address reference signal CA_Ref2, transmitted through the CA reference bus, to the comparator 1806 as the second command/address reference signal CA_Ref2. The comparator 1806 may compare data of the first command/address reference signal CA_Ref1 with data of the second command/address reference signal CA_Ref2 to generate a pass or fail signal P/F. Note that the second command/address reference signal CA_Ref2 is converted to the third command/address reference signal CA_Ref3 by the data input unit 1810. The phase/timing controller 1808 may generate a control signal CTR, indicating a phase shift of the command/address signal CA, according to the pass or fail signal P/F of the comparator 1806. The CA generator 1802 may generate a command/address signal CA having a phase adjusted according to the control signal CTR.

Due to repetition of such a CA calibration operation, the phase/timing controller 1808 of the controller 1800 may determine a middle of passed locations to be a middle of a command/address signal (CA) window, and may generate a command/address signal CA such that the middle of the command/address signal (CA) window is disposed on an edge of the clock signal CK and transmit the generated command/address signal CA to the memory device 1900. Accordingly, the memory device 1900 may receive a command/address signal CA, in which a middle of an effective window is disposed on rising/falling edges of a pair of clock signals CK and CKB, on rising/falling edges of the clock signal CK.

The memory system 1000 according to an example embodiment of the present disclosure may include the controller 1800, generating a PIM mode, and the memory device 1900 receiving mode information from the controller 1800 to control an operation mode.

The controller 1800 may further include a PIM mode generator 1820 for generating mode information corresponding to one of PIM/normal modes. The PIM mode generator 1820 may determine a memory parameter/MRS setting/a refresh type, according to the PIM/normal modes.

The memory device 1900 may include a PIM mode controller 1920 for receiving mode information to operate in the PIM mode or the normal mode. The PIM mode controller 1920 may determine a refresh type, set an MSR, adjust an AC parameter, or determine a refresh mode, based on the mode information.

A memory system according to an example embodiment of the present disclosure may be disposed on a single substrate.

Figure 16:
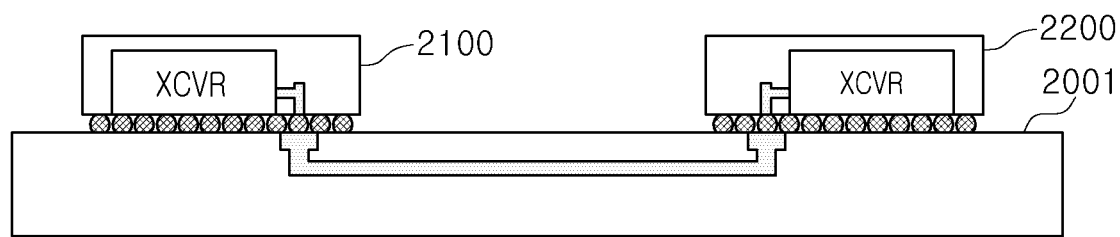
FIG. 16 is a view illustrating a memory system according to an example embodiment of the present disclosure.

FIG. 16 is a view illustrating a memory system 2000 according to an example embodiment of the present disclosure. Referring to FIG. 16, the memory system 2000 may include a controller chip 2100 and a memory chip 2200 mounted on a substrate 2001. In an embodiment of the inventive concept, the controller chip 2100 and the memory chip 2200 may be connected through the substrate 2001 having an interposer. Each of the controller chip 2100 and the memory chip 2200 may be configured to perform the dynamic mode change described in FIGS. 1 to 15.

A memory device according to an example embodiment of the present disclosure may be applied to a computing system.

Figure 17:
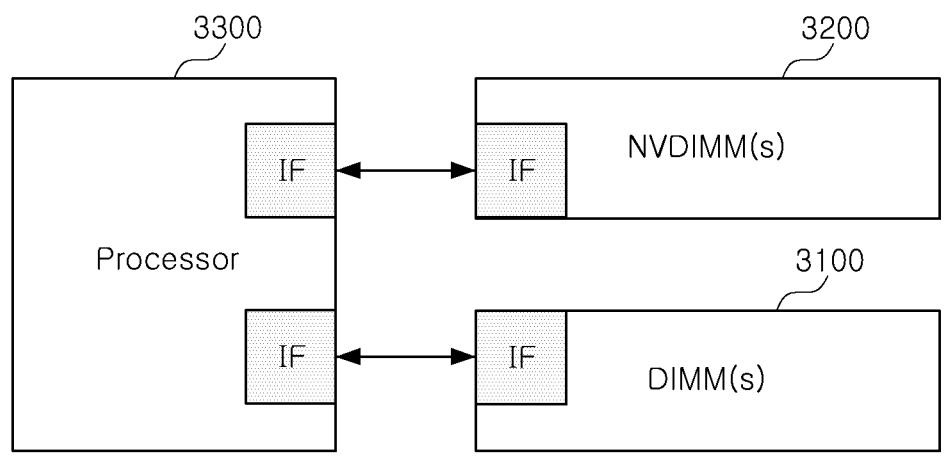
FIG. 17 is a view illustrating a computing system according to another example embodiment of the present disclosure.

FIG. 17 is a view illustrating a computing system 300 according to another example embodiment of the present disclosure. Referring to FIG. 17, the computing system 3000 may include at least one volatile memory module (DIMM(s)) 3100, at least one nonvolatile memory module (NVDIMM(s)) 3200, and at least one central processing unit (CPU(s)), 3300.

The computing system 3000 may be one of a plurality of devices such as a computer, a portable computer, an ultra-mobile personal computer (UMPC), a workstation, a data server, a netbook, a personal data assistant (PDA), a web tablet, a wireless phone, a mobile phone, a smartphone, an e-book, a portable multimedia player (PMP), a digital camera, a digital audio recorder/player, a digital picture/video recorder/player, a portable game machine, a navigation system, a black box, a three-dimensional (3D) television, a device capable of transmitting and receiving information wirelessly, a wearable device, one of various electronics devices constituting a home network, one of various electronics devices constituting a computer network, one of various electronics devices constituting a telematics network, a radio-frequency identification (RFID), one of various electronic devices constituting a computing system, or the like.

The at least one nonvolatile memory module 3200 may include at least one nonvolatile memory. In an example embodiment of the present disclosure, the at least one nonvolatile memory may include a NAND flash memory, a vertical NAND flash memory (VNAND), a NOR flash memory, a resistive random access memory (RRAM), a phase-change memory (PRAM), a magneto-resistive random access memory (MRAM), a ferroelectric random access memory (FRAM), a spin transfer toque random access memory (STT-RAM), a thyristor random access memory (TRAM), or the like.

In an embodiment of the present disclosure, at least one of the memory modules 3100 and 3200 may include an interface circuit IF, and a PIM mode controller so that the at least one memory module can perform the dynamic mode change described with reference to FIGS. 1 to 15.

In an embodiment of the present disclosure, the memory modules 3100 and 3200 may be connected to at least one the central processing unit 3300 according to a DDRx interface (where x is an integer of 1 or more).

The at least one central processing unit 3300 may control the volatile memory module 3100 and the nonvolatile memory module 3200. In an embodiment of the present disclosure, the at least one central processing unit 3300 may include a general purpose microprocessor, a multicore processor, a digital signal processor (DSP), an application specific integrated circuit (ASIC), or a combination thereof.

An internal operation method according to an example embodiment of the present disclosure may be performed in a stacked memory package chip.

Figure 18:
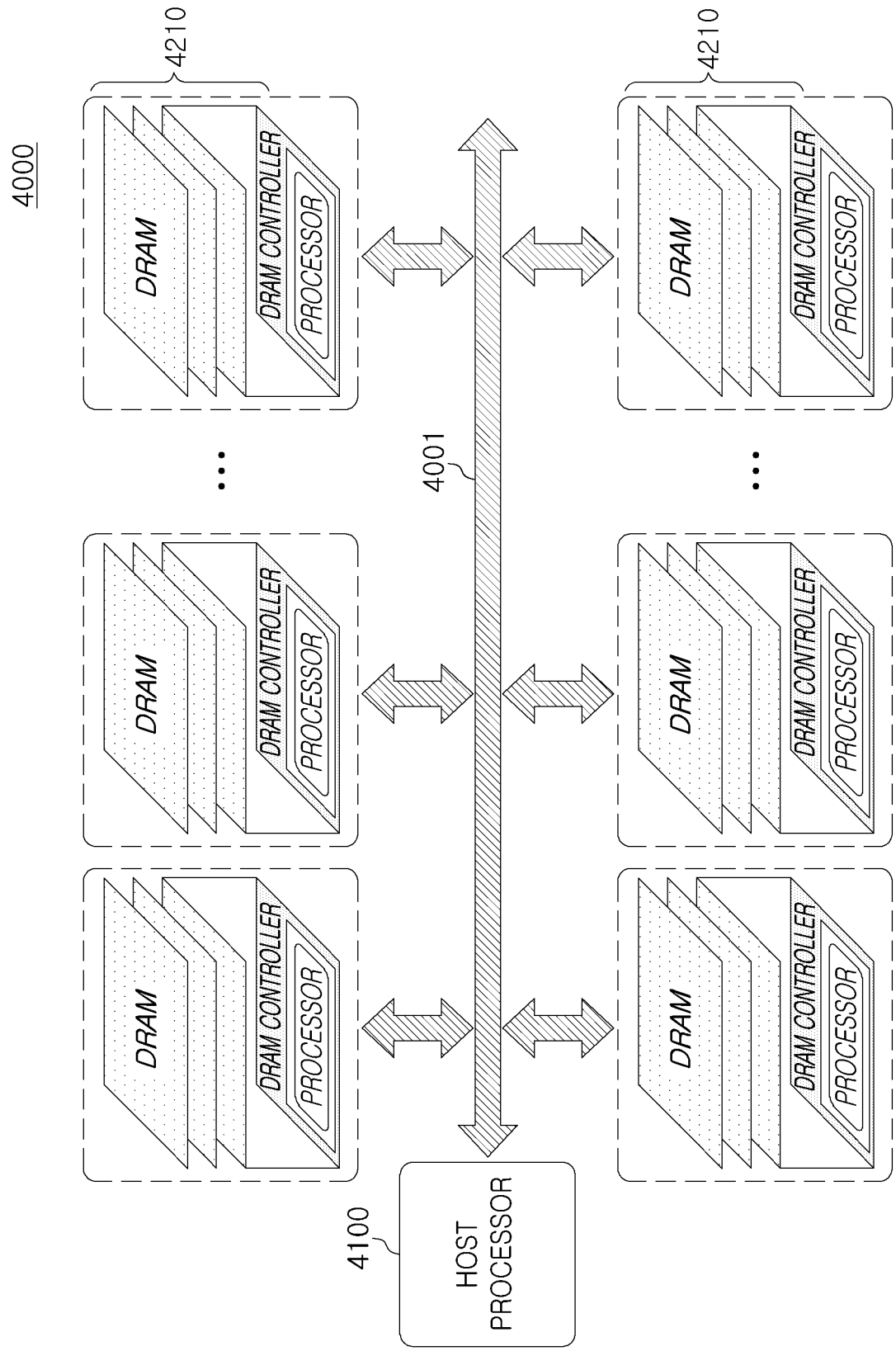
FIG. 18 is a view illustrating a computing system according to another example embodiment of the present disclosure.

FIG. 18 is a view illustrating a computing system 400 according to another example embodiment of the present disclosure. Referring to FIG. 18, a computing system 4000 may include a host processor 4100 and at least one memory package chip 4210 controlled by the host processor 4100.

In an embodiment of the present disclosure, the host processor 4100 and the memory package chip 4210 may transmit and receive data through a channel 4001.

The memory package chip 4210 may include stacked memory chips and a controller chip. As illustrated in FIG. 18, the memory package chip 4210 may include a plurality of DRAM chips disposed on a DRAM controller chip. It will be understood that a configuration of the memory package chip according to the present disclosure is not limited thereto.

In an embodiment of the present disclosure, each of the memory chips may be configured to perform the dynamic mode change and the internal operation described in FIGS. 1 to 17. However, the present disclosure is not necessarily limited thereto. An internal operation may be performed between stacked memory chips of the memory package chip 4210 and a controller chip. In this case, an operation mode change may also be dynamically performed in a manner similar to the manner described in FIGS. 1 to 17.

A data communications method according to an example embodiment of the present disclosure may be applied to a data center.

Figure 19:
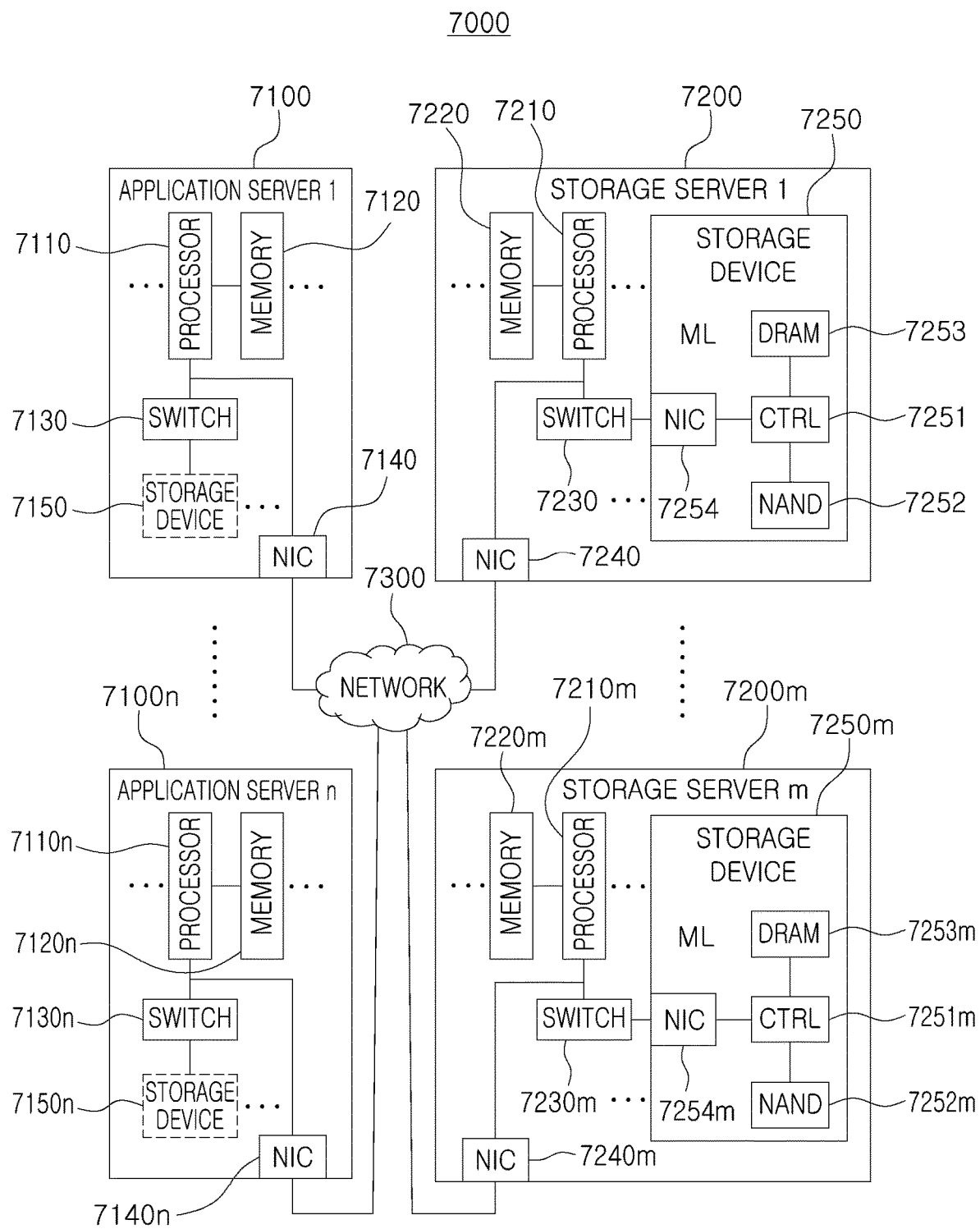
FIG. 19 is a view illustrating a data center to which a memory device according to an example embodiment of the present disclosure is applied.

FIG. 19 is a view illustrating a data center to which a memory device according to an example embodiment of the present disclosure is applied. Referring to FIG. 19, a data center 7000 is a facility, collecting various types of data and providing services, and may also be referred to as a data storage center. The data center 7000 may be a system for managing a search engine and database, and may be a computing system used in a company such as a bank or (an organization such as) a government agency. The data center 7000 may include application servers 7100 to 7100n and storage servers 7200 to 7200m. The number of application servers 7100 to 7100n and the number of storage servers 7200 to 7200m may be variously selected according to example embodiments of the present disclosure, and the number of application servers 7100 to 7100n and storage servers 7200 to 7200m may be different from each other.

The application server 7100 or the storage server 7200 may include at least one of processors 7110 (e.g., 7110 to 7110n) and 7210 (e.g., 7210 to 7210m) and memories 7120 (e.g., 7120 to 7120n) and 7220 (e.g., 7220 to 7220m). To describe the storage server 7200 as an example, the processor 7210 may control the overall operation of the storage server 7200 and may access the memory 7220 to execute a command and/or data loaded in the memory 7220. The memory 7220 may be a double data rate synchronous DRAM (DDR SDRAM), a high bandwidth memory (HBM), a hybrid memory cube (HMC), a dual in-line memory module (DIMM), an optane DIMM, or a non-volatile DIMM (NVMDIMM). According to embodiments of the present disclosure, the number of the processors 7210 included in the storage server 7200 may be variously selected.

In an embodiment of the present disclosure, the processor 7210 and the memory 7220 may provide a processor-memory pair. In an embodiment of the present disclosure, the number of the processors 7210 and the memories 7220 may be different from each other. The processor 7210 may include a single-core processor or a multiple core processor. The description of the storage server 7200 may be similarly applied to the application server 7100. According to embodiments of the present disclosure, the application server 7100 may not include storage device 7150. The storage server 7200 may include at least one storage device 7250. The storage device 7250 may be configured to perform a dynamic mode change between a PIM mode and a normal mode, as described with reference to FIGS. 1 to 18.

The application servers 7100 to 7100n and the storage servers 7200 to 7200m may communicate with each other through a network 7300. The network 7300 may be implemented using a fiber channel (FC), an Ethernet, or the like. The FC may be a medium used for data transmission at relatively high speed and may employ an optical switch providing high performance/high availability. The storage servers 7200 to 7200m may be provided as a file storage, a block storage, or an object storage according to an access method of the network 7300.

In an example embodiment of the present disclosure, the network 7300 may be a storage area network (SAN). For example, the SAN may be an FC-SAN using an FC network and implemented according to an FC protocol (FCP). As another example, the SAN may be an IP-SAN using a TCP/IP network and implemented according to a SCSI over TCP/IP or Internet SCSI (iSCSI) protocol. In another example embodiment of the present disclosure, the network 7300 may be a general network such as a TCP/IP network. For example, the network 7300 may be implemented according to a protocol such as FC over Ethernet (FCoE), a network attached storage (NAS), an NVMe over Fabrics (NVMe-oF), or the like.

Hereinafter, a description will be provided while focusing on the application server 7100 and the storage server 7200. The description of the application server 7100 may be applied to another application server 7100n, and the description of the storage server 7200 may be applied to another storage server 7200m.

The application server 7100 may store data, requested to be stored by a user or a client, in one of the storage servers 7200 to 7200m through the network 7300. In addition, the application server 7100 may obtain data, requested to be read by the user or the client, from one of the storage servers 7200 to 7200m through the network 7300. For example, the application server 7100 may be a web server, a database management system (DBMS), or the like.

The application server 7100 may access the memory 7120n or the storage device 7150n included in another application server 7100n through the network 7300, or may access the memories 7220 to 7220m or the storage devices 7250 to 7250m included in the storage servers 7200 to 7200m through the network 7300. Accordingly, the application server 7100 may perform various operations on data stored in the application servers 7100 to 7100n and/or storage servers 7200 to 7200m. For example, the application server 7100 may execute a command to move or copy data between the application servers 7100 to 7100n and/or storage servers 7200 to 7200m. In this case, the data may be moved from the storage servers 7200 to 7200m to the storage devices 7250 to 7250m to the storage servers 7200 to 7200m through the memories 7220 to 7220m, or may be directly moved to the memories 7120 to 7120n of the application servers 7100 to 7100n. Data, moved through the network 7300, may be data encrypted for security or privacy.

To describe the storage server 7200 as an example, the interface 7254 may provide a physical connection between the processor 7210 and a controller 7251 and a physical connection between an NIC 7240 and the controller 7251. For example, the interface 7254 may be implemented by a direct attached storage (DAS) method in which the storage device 7250 is directly connected to an exclusive cable. In addition, for example, the interface 1254 be implemented in various interface manners such as Advanced Technology Attachment (ATA), Serial ATA (SATA), external SATA (e-SATA), Small Computer Small Interface (SCSI), Serial Attached SCSI (SAS), Peripheral PCI Component Interconnection (PCI express), PCIe (NV express), NVMe (NVM express), IEEE 1394, universal serial bus (USB), secure digital (SD) card, multi-media card (MMC), embedded multi-media card (eMMC), Universal Flash Storage (UFS), Embedded Universal Flash Storage (eUFS), Compact Flash (CF) card interface, and the like.

The storage server 7200 may further include a switch 7230 and an MC 7240. The switch 7230 may selectively connect the processor 7210 and the storage device 7250 to each other or selectively connect the NIC 7240 and the storage device 7250 to each other under the control of the processor 7210.

In an example embodiment of the present disclosure, the NIC 7240 may include a network interface card, a network adapter, and the like. The NIC 7240 may be connected to the network 7300 by a wired interface, a wireless interface, a Bluetooth interface, an optical interface, or the like. The NIC 7240 may include an internal memory, a digital signal processor (DSP), a host bus interface, and the like, and may be connected to the processor 7210 and/or the switch 7230 through a host bus interface. The host bus interface may be implemented as one of the above-described examples of the interface 7254. In an example embodiment of the present disclosure, the NIC 7240 may be integrated with at least one of the processor 7210, the switch 7230, and the storage 7250.

In the storage servers 7200 to 7200*m* or the application servers 7100 to 7100*n*, the processor may transmit data to the storage devices 7150 to 7150*n* and 7250 to 7250*m* or transmit a command to the memories 7120 to 7120*n* and 7220 to 7220*m* to program or read the data. In this case, the data may be error-corrected data corrected through an error correction code (ECC) engine. The data is data subjected to data bus inversion (DBI) or data masking (DM), and may include cyclic redundancy code (CRC) information. The data may be data encrypted for security or privacy.

The storage device 7150 to 7150*n* and 7250 to 7250*m* may transmit a control signal and a command/address signal to the NAND flash memory devices 7252 to 7252*m* in response to a read command received from the processor. Accordingly, when data is read from the NAND flash memory device 7252 to 7252*m*, a read enable signal RE may be input as a data output control signal to output data to a DQ bus. A data strobe DQS may be generated using the read enable signal RE. The command and the address signal may be latched in a page buffer according to a rising edge or a falling edge of a write enable signal WE.

The controller 7251 can control overall operation of the storage device 7250. Each of the storage devices 7250 to 7250*m* includes a respective one of the controllers 7251 to 7251*m*. In an example embodiment of the present disclosure, the controller 7251 may include a static random access memory (SRAM). The controller 7251 may write data to the NAND flash 7252 in response to a write command, or may read data from the NAND flash 7252 in response to a read command. For example, the write command and/or the read command may be provided from the processor 7210 in the storage server 7200, the processor 7210*m* in another storage server 7200*m*, or the processors 7110 and 7110*n* in the application servers 7100 and 7100*n*. The DRAM 7253 may temporarily store (e.g., buffer) data to be written to the NAND flash 7252 or data read from the NAND flash 7252. In addition, the DRAM 7253 may store metadata. Each of the storage devices 7250 to 7250*m* includes a respective one of the DRAMs 7253 to 7253*m*. The metadata is user data or data generated by the controller 7251 to manage the NAND flash memory 7252. The storage device 7250 may include a secure element (SE) for security or privacy.

Each of the application servers 7100 to 7100*n* may respectively include a switch 7130 to 7130*n*, and a network interface circuit 7140 to 7140*n*. Each of the storage servers 7200 to 7200*m* may respectively includes a switch 7230 to 7230*m*, a network interface circuit 7240 to 7240*m*. In addition, each of the storage devices 7250 to 7250*m* may respectively include a network interface circuit 7254 to 7254*m*.

The present disclosure discloses a method of controlling a DRAM, in which an arithmetic operation device PE/ALU is incorporated, and a mode change method. A memory system according to the present disclosure may include a DRAM in which an arithmetic operation device is incorporated, a memory controller for controlling the DRAM, a signal for activating the arithmetic operation device in the DRAM, a selector for changing a mode in the DRAM, a unit for managing DRAM refresh/parameter/MRS, or the like, according to the mode.

In an embodiment of the present disclosure, a mode in which ACT/RD/WR/PRECHARGE operations may be simultaneously performed in a plurality of banks by a single command, which is not provided in a conventional DRAM, to significantly improve performance of the arithmetic operation device. According to the present disclosure, a mode in which a plurality of banks operate and a normal mode of the DRAM (in which only one bank operates with one command) may dynamically vary during an operation of the DRAM. Due to the dynamic variation of the normal mode of the DRAM and the mode in which a plurality of banks operate at the same time, unnecessary setting time required for mode shift may be removed. Thus, system performance may be improved.

As described above, example embodiments of the present disclosure provide a memory device, a memory system including the same, a controller controlling the same, and a method of operating the same. An operation mode or an internal operation environment may be dynamically changed to perform an internal operation in an optimal state.

In addition, an internal operation may be performed in an optimal state to improve system performance.

While example embodiments of the present disclosure have been shown and described above, it will be apparent to those skilled in the art that modifications and variations could be made thereto without departing from the scope of the present disclosure as set forth by the appended claims.

What is claimed is:

1. A memory device, comprising:
   a plurality of pins for receiving control signals from an external device;
   a first bank having first memory cells, wherein the first bank is activated in a first operation mode and a second operation mode;

a second bank having second memory cells, wherein the second bank is deactivated in the first operation mode and activated in the second operation mode;

a processing unit configured to perform an operation on first data, output from the first memory cells, and second data, output from the second memory cells, in the second operation mode; and a processing-in-memory (PIM) mode controller configured to select mode information, indicating one of the first operation mode and the second operation mode, in response to the control signals and to control at least one memory parameter, at least one mode register set (MRS) value, or a refresh mode according to the mode information.

2. The memory device of claim 1, wherein the PIM mode controller comprises a memory parameter controller configured to control the at least one memory parameter based on the mode information.

3. The memory device of claim 1, wherein the PIM mode controller comprises an MRS controller configured to vary the at least one MRS value based on the mode information.

4. The memory device of claim 1, wherein a per-bank refresh operation is performed in the first operation mode, and
an all-bank refresh operation is performed in the second operation mode.

5. The memory device of claim 1, wherein the at least one memory parameter comprises an activate (ACT) to internal read or write delay time (tRCD), an ACT to ACT or REF command period (tRC), an ACT to ACT command delay (tRRD), or a four activate window (tFAW).

6. The memory device of claim 3, wherein varying the at least one MRS value comprises controlling a counter with write latency (WL), column address strobe (CAS) latency (CL), a write command (WR), a row address strobe (RAS), a CAS, or a sum of additive latency (AL) and CL.

7. The memory device of claim 1, wherein the PIM mode controller dynamically changes the first operation mode and the second operation mode in response to the control signals.

8. The memory device of claim 1, further comprising:
a command decoder configured to receive the control shawls and to output a corresponding mode change command, wherein the PIM mode controller comprises:
a mode selector configured to select one of the first and second operation modes in response to the mode change command; and
a clock divider configured to receive a clock from the external device and to generate an internal operation clock for driving the processing unit in the second operation mode.

9. The memory device of claim 1, wherein both the first bank and the second bank are precharged before and after an operation mode change.

10. The memory device of claim 1, wherein an all-bank precharge operation is internally performed before and after an operation mode change.

11. The memory device of claim 1, wherein the PIM mode controller enters the second operation mode using a predetermined Row Address (RA)/Bank Address (BA) code and an active command, and exits the PIM mode using a combination of the predetermined RA/BA code, the active command, and a precharge command of the BA.

12. A memory system, comprising:
a memory device configured to operate in one of a first operation mode and a second operation mode in response to a mode change command, wherein the memory device includes first banks and second banks; and
a controller configured to control the memory device, wherein the controller includes a processing-in-memory (PIM) mode generator configured to generate a mode change command for selecting one of the first and second operation modes,
wherein the memory device comprises:
a plurality of pins for receiving a plurality of control signals from the controller;
a PIM mode controller configured to activate one of the first and second banks in the first operation mode and to activate at least one of the first banks and at least one of the second banks in the second operation mode in response to the mode change command; and
a processing unit configured to perform an operation on first data output from the activated first bank and second data output from the activated second bank.

13. The memory system of claim 12, wherein the controller issues a bank precharge command for precharging the first and second banks before and after changing an operation mode of the at least one memory device.

14. The memory system of claim 12, wherein the memory device internally precharges the first and second banks before and after changing an operation mode of the at least one memory device.

15. The memory system of claim 12, wherein the controller controls the memory device to dynamically change a refresh mode, at least one memory parameter, or a mode register set (MRS) value according to the selected mode.

16. The memory system of claim 12, wherein the controller comprises:
a refresh management unit configured to output refresh information selecting one of an all-bank refresh operation and a per-bank refresh operation according to the selected mode;
a memory parameter management unit configured to change at least one memory parameter according to the selected mode; and
a mode register set (MRS) management unit configured output MRS setting information changing at least MRS value according to the selected mode.

17. A method of operating a memory device, the method comprising:
receiving a mode change request from a controller;
changing an operation mode of the memory device in response to the mode change request;
receiving an internal operation request in the changed operation mode; and
performing an operation on data output from at leas two activated banks of the memory device in response to the internal operation request.

18. The method of claim 17, wherein the mode change request comprises information to change a mode register set (MRS) value.

19. The method of claim 18, wherein the changing of the operation mode comprises changing an MRS-related operation code value in response to the mode change request.

20. The method of claim 18, wherein the mode change request comprises an active command and a precharge command.

* * * * *